: US 9,106,253 B2

United States Patent
Hagihara

(10) Patent No.: US 9,106,253 B2
(45) Date of Patent: Aug. 11, 2015

(54) AD CONVERSION CIRCUIT AND SOLID-STATE IMAGING APPARATUS

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 142 days.

(21) Appl. No.: 14/027,653

(22) Filed: Sep. 16, 2013

(65) Prior Publication Data

US 2014/0077065 A1    Mar. 20, 2014

(30) Foreign Application Priority Data

Sep. 19, 2012   (JP) .................................. 2012-206292

(51) Int. Cl.
| | |
|---|---|
| *H03M 1/34* | (2006.01) |
| *H04N 5/378* | (2011.01) |
| *H03M 1/06* | (2006.01) |
| H04N 5/374 | (2011.01) |
| H03M 1/56 | (2006.01) |

(52) U.S. Cl.
CPC .............. *H03M 1/34* (2013.01); *H03M 1/0624* (2013.01); *H04N 5/378* (2013.01); *H03M 1/56* (2013.01); *H04N 5/374* (2013.01)

(58) Field of Classification Search
CPC ........................... H04N 5/378; H04N 5/37455
USPC ...................................... 250/208.1; 341/164
See application file for complete search history.

(56) References Cited

U.S. PATENT DOCUMENTS

2012/0138772 A1*   6/2012   Hagihara .................... 250/208.1

FOREIGN PATENT DOCUMENTS

| JP | 2008-092091 A | 4/2008 |
| JP | 2009-038726 A | 2/2009 |

* cited by examiner

*Primary Examiner* — Thanh Luu
(74) *Attorney, Agent, or Firm* — Westerman, Hattori, Daniels & Adrian, LLP

(57) ABSTRACT

An AD conversion circuit and a solid-state imaging apparatus reduce the occurrence of errors in encoding a lower phase signal while securing a degree of freedom of selection of a count clock. A detection circuit performs an operation of detecting logic states of m (m is a natural number of 2 or more) lower phase signals in a signal group that a plurality of lower phase signals latched by the latch unit is arranged, while selecting the m lower phase signals in a predetermined order so that the order thereof becomes the same as the order of the signal group and outputs a state detection signal at the time of detecting that the logic states of the m lower phase signals are in a predetermined logic state in the detection operation. The predetermined order is defined depending on a predetermined signal and an encoding method.

4 Claims, 17 Drawing Sheets

FIG. 12

| ENCODE VALUE | L_13 CK[13] | L_11 CK[11] | L_9 CK[9] | L_7 CK[7] | L_5 CK[5] | L_3 CK[3] | L_1 CK[1] | L_14 CK[14] | L_12 CK[12] | L_10 CK[10] | L_8 CK[8] | L_6 CK[6] | L_4 CK[4] | L_2 CK[2] | L_0 CK[0] | L_15 CK[15] |
|---|---|---|---|---|---|---|---|---|---|---|---|---|---|---|---|---|
| 0 | 1 | 1 | 1 | 1 | 1 | 1 | 1 | 1/0 | 0 | 0 | 0 | 0 | 0 | 0 | 0 | 0 |
| 1 | 1 | 1 | 1 | 1 | 1 | 1 | 1 | 0 | 0 | 0 | 0 | 0 | 0 | 0 | 0 | 1 |
| 2 | 1 | 1 | 1 | 1 | 1 | 1 | 1/0 | 0 | 0 | 0 | 0 | 0 | 0 | 0 | 1 | 1 |
| 3 | 1 | 1 | 1 | 1 | 1 | 1/0 | 0 | 0 | 0 | 0 | 0 | 0 | 0 | 1 | 1 | 1 |
| 4 | 1 | 1 | 1 | 1 | 1/0 | 0 | 0 | 0 | 0 | 0 | 0 | 0 | 1 | 1 | 1 | 1 |
| 5 | 1 | 1 | 1 | 1/0 | 0 | 0 | 0 | 0 | 0 | 0 | 0 | 1 | 1 | 1 | 1 | 1 |
| 6 | 1 | 1 | 1/0 | 0 | 0 | 0 | 0 | 0 | 0 | 0 | 1 | 1 | 1 | 1 | 1 | 1 |
| 7 | 1 | 1/0 | 0 | 0 | 0 | 0 | 0 | 0 | 0 | 1 | 1 | 1 | 1 | 1 | 1 | 1 |
| 8 | 1/0 | 0 | 0 | 0 | 0 | 0 | 0 | 0 | 1 | 1 | 1 | 1 | 1 | 1 | 1 | 1 |
| 9 | 0 | 0 | 0 | 0 | 0 | 0 | 0 | 1 | 1 | 1 | 1 | 1 | 1 | 1 | 1 | 1 |
| 10 | 0 | 0 | 0 | 0 | 0 | 0 | 1 | 1 | 1 | 1 | 1 | 1 | 1 | 1 | 1 | 0 |
| 11 | 0 | 0 | 0 | 0 | 0 | 1 | 1 | 1 | 1 | 1 | 1 | 1 | 1 | 1 | 1/0 | 0 |
| 12 | 0 | 0 | 0 | 0 | 1 | 1 | 1 | 1 | 1 | 1 | 1 | 1 | 1 | 1/0 | 0 | 0 |
| 13 | 0 | 0 | 0 | 1 | 1 | 1 | 1 | 1 | 1 | 1 | 1 | 1 | 1/0 | 0 | 0 | 0 |
| 14 | 0 | 0 | 1 | 1 | 1 | 1 | 1 | 1 | 1 | 1 | 1 | 1/0 | 0 | 0 | 0 | 0 |
| 15 | 0 | 1 | 1 | 1 | 1 | 1 | 1 | 1 | 1 | 1 | 1/0 | 0 | 0 | 0 | 0 | 0 |

LOWER PHASE SIGNAL INPUT TO LATCH UNIT 1108 CIRCULATES AS TIME PASSES

FIG. 15

| ENCODE VALUE | L2 CK[2] | L0 CK[0] | L15 CK[15] | L13 CK[13] | L11 CK[11] | L9 CK[9] | L7 CK[7] | L5 CK[5] | L3 CK[3] | L1 CK[1] | L14 CK[14] | L12 CK[12] | L10 CK[10] | L8 CK[8] | L6 CK[6] | L4 CK[4] |
|---|---|---|---|---|---|---|---|---|---|---|---|---|---|---|---|---|
| 0  | 1 | 1 | 1 | 1 | 1 | 1 | 1 | 1 | 1/0 | 0 | 0 | 0 | 0 | 0 | 0 | 0 |
| 1  | 1 | 1 | 1 | 1 | 1 | 1 | 1 | 1/0 | 0 | 0 | 0 | 0 | 0 | 0 | 0 | 1 |
| 2  | 1 | 1 | 1 | 1 | 1 | 1 | 1/0 | 0 | 0 | 0 | 0 | 0 | 0 | 0 | 1 | 1 |
| 3  | 1 | 1 | 1 | 1 | 1 | 1/0 | 0 | 0 | 0 | 0 | 0 | 0 | 0 | 1 | 1 | 1 |
| 4  | 1 | 1 | 1 | 1 | 1/0 | 0 | 0 | 0 | 0 | 0 | 0 | 0 | 1 | 1 | 1 | 1 |
| 5  | 1 | 1 | 1 | 1/0 | 0 | 0 | 0 | 0 | 0 | 0 | 0 | 1 | 1 | 1 | 1 | 1 |
| 6  | 1 | 1 | 1/0 | 0 | 0 | 0 | 0 | 0 | 0 | 0 | 1 | 1 | 1 | 1 | 1 | 1 |
| 7  | 1 | 1/0 | 0 | 0 | 0 | 0 | 0 | 0 | 0 | 1 | 1 | 1 | 1 | 1 | 1 | 1 |
| 8  | 1/0 | 0 | 0 | 0 | 0 | 0 | 0 | 0 | 1 | 1 | 1 | 1 | 1 | 1 | 1 | 1 |
| 9  | 0 | 0 | 0 | 0 | 0 | 0 | 0 | 1 | 1 | 1 | 1 | 1 | 1 | 1 | 1 | 1/0 |
| 10 | 0 | 0 | 0 | 0 | 0 | 0 | 1 | 1 | 1 | 1 | 1 | 1 | 1 | 1 | 1/0 | 0 |
| 11 | 0 | 0 | 0 | 0 | 0 | 1 | 1 | 1 | 1 | 1 | 1 | 1 | 1 | 1/0 | 0 | 0 |
| 12 | 0 | 0 | 0 | 0 | 1 | 1 | 1 | 1 | 1 | 1 | 1 | 1 | 1/0 | 0 | 0 | 0 |
| 13 | 0 | 0 | 0 | 1 | 1 | 1 | 1 | 1 | 1 | 1 | 1 | 1/0 | 0 | 0 | 0 | 0 |
| 14 | 0 | 0 | 1 | 1 | 1 | 1 | 1 | 1 | 1 | 1 | 1/0 | 0 | 0 | 0 | 0 | 0 |
| 15 | 0 | 1 | 1 | 1 | 1 | 1 | 1 | 1 | 1 | 1/0 | 0 | 0 | 0 | 0 | 0 | 0 |

LOWER PHASE SIGNAL INPUT TO LATCH UNIT 1108 CIRCULATES AS TIME PASSES

FIG. 16

| ENCODE VALUE | L_13 CK[13] | L_11 CK[11] | L_9 CK[9] | L_7 CK[7] | L_5 CK[5] | L_3 CK[3] | L_1 CK[1] | L_14 CK[14] | L_12 CK[12] | L_10 CK[10] | L_8 CK[8] | L_6 CK[6] | L_4 CK[4] | L_2 CK[2] | L_0 CK[0] | L_15 CK[15] |
|---|---|---|---|---|---|---|---|---|---|---|---|---|---|---|---|---|
| 1 | 0 | 0 | 0 | 0 | 0 | 0 | 0 | 1 | 1 | 1 | 1 | 1 | 1 | 1 | 0 | 1 |

DETERMINE ONE DETERMINED TO BE ENCODE VALUE: "9" AS ENCODE VALUE: "1"

FIG. 17

| ENCODE VALUE | L_2 CK[2] | L_0 CK[0] | L_15 CK[15] | L_13 CK[13] | L_11 CK[11] | L_9 CK[9] | L_7 CK[7] | L_5 CK[5] | L_3 CK[3] | L_1 CK[1] | L_14 CK[14] | L_12 CK[12] | L_10 CK[10] | L_8 CK[8] | L_6 CK[6] | L_4 CK[4] |
|---|---|---|---|---|---|---|---|---|---|---|---|---|---|---|---|---|
| 14 | 1 | 0 | 1 | 0 | 0 | 0 | 0 | 0 | 0 | 0 | 1 | 1 | 1 | 1 | 1 | 1 |

DETERMINE ONE DETERMINED TO BE ENCODE VALUE: "6" AS ENCODE VALUE: "14"

AD CONVERSION CIRCUIT AND SOLID-STATE IMAGING APPARATUS

BACKGROUND OF THE INVENTION

1. Field of the Invention

The present invention relates to an AD conversion circuit and a solid-state imaging apparatus including the AD conversion circuit.

Priority is claimed on Japanese Patent Application No. 2012-206292, filed Sep. 19, 2012, the content of which is incorporated herein by reference.

2. Description of Related Art

As an example of a solid-state imaging apparatus using a time-to-digital converter (TDC) type AD conversion circuit, a constitution described in Japanese Unexamined Patent Application, First Publication No. 2008-92091 and Japanese Unexamined Patent Application, First Publication No. 2009-38726 is known. FIG. 9 illustrates a part taken from a constitution of the TDC type AD conversion circuit when an oscillation circuit referred to as a so-called "asymmetric type oscillation circuit" is used as a voltage controlled oscillator (VCO) of an AD conversion circuit. First, the constitution and operation of the circuit of FIG. 9 will be described.

The circuit illustrated in FIG. 9 includes a VCO 1100, a latch unit 1108, a counter 1105, a detection circuit 1107, and an encoding circuit 1106. The VCO 1100 includes an oscillation circuit in which seventeen delay units (NAND circuits NAND[0] to NAND[16]) are connected in a ring shape. The latch unit 1108 latches an output signal (lower phase signals CK[0] to CK[15]) of the VCO 1100. The counter 1105 has a counter circuit which counts a lower phase signal CK[13] from the NAND circuit NAND[13] output through the latch unit 1108 as a count clock. The counter 1105 counts a rising edge of the lower phase signal CK[13]. The detection circuit 1107 detects a predetermined logic state based on the lower phase signals CK[0] to CK[15] latched by the latch unit 1108. The encoding circuit 1106 encodes the logic state detected by the detection circuit 1107 into a binary number.

A start pulse StartP is input to one input terminal of the NAND circuit NAND[0] constituting the VCO 1100 and an output signal of the NAND circuit NAND[16] is input to the other input terminal thereof. A power supply voltage VDD is input to one input terminal of the NAND circuits NAND[1] to NAND[15] and an output signal of the NAND circuit of a preceding stage is input to the other input terminal thereof. The power supply voltage VDD is set to be a high level during an operation period of the AD conversion circuit. An output signal of the NAND circuit NAND[13] is input to one input terminal of the NAND circuit NAND[16] and an output signal of the NAND circuit NAND[15] of a preceding stage is input to the other input terminal thereof. An output signal of the NAND circuit NAND[13] is input to the NAND circuit NAND[16] three stages later, in addition to the NAND circuit NAND[14] one stage later.

A signal based on the start pulse StartP input to the NAND circuit NAND[0] is transmitted through two types of paths and passes through the NAND circuits NAND[0] to NAND [16]. A first path is a path to which a signal is transmitted through a signal line which connects the other input terminal of each NAND circuit with an output terminal of the NAND circuit of the preceding stage thereof. A second path is a path (a bypass path) to which a signal output from the NAND circuit NAND[13] is transmitted through a signal line which connects the output terminal of the NAND circuit NAND[13] with an input terminal of the NAND circuit NAND[16]. The signal transmitted through the second path reaches the NAND circuit NAND [16] by bypassing these NAND circuits NAND [14] and NAND[15], without passing through the NAND circuits NAND[14] and NAND[15] on the first path. By the above constitution, a feed forward loop is formed and thus the so-called 'asymmetric type oscillation circuit" is constituted.

Next, an operation of the circuit illustrated in FIG. 9 will be described. FIG. 10 illustrates waveforms of the start pulse StartP and the output signal (lower phase signals CK[0] to CK[16]) of the VCO 1100. First, a logic state of the start pulse StartP is changed from an L (low) state to an H (high) state, such that the VCO 1100 starts a transition operation. In the transition operation, the logic states of the signals output from each of the NAND circuits constituting the VCO 1100 are changed in order. The VCO 1100 starts the transition operation and simultaneously, the counter 1105 starts a count and a reference signal generation unit (not illustrated) starts to generate a ramp wave (a reference signal). The ramp wave generated by the reference signal generation unit is a signal of which the level increases or decreases in one direction as time passes.

An analog signal and the ramp wave which are targets of the AD conversion are input to a comparison unit (not illustrated). At the same time, the lower phase signals CK[0] to CK[15] are input to the latch unit 1108 and the lower phase signal CK[13] is input to the counter 1105 through the latch unit 1108. When a large and small relationship between the two input signals input to the comparison unit is replaced, a comparison output CO of the comparison unit is inverted. At this time, the latch unit 1108 latches the logic state corresponding to the lower phase signals CK[0] to CK[15] and the counter 1105 latches a count value (an upper count value). The lower phase signal latched by the latch unit 1108 is encoded (binarized) by the detection circuit 1107 and the encoding circuit 1106 and thus becomes lower data of digital data, and the upper count value latched by the counter 1105 becomes an upper data of the digital data. Thus, the digital data corresponding to the level of the analog signal is obtained.

Hereinafter, the case in which the signal (the lower phase signal) held by the latch unit 1108 is a 16-bit data signal and the count value (the upper count value) held by the counter 1105 is an 8-bit data signal will be described.

For encoding of the lower phase signal, it is preferable to perform a comparison of a multiple value (detecting whether the logic states of consecutive n numbers, for example, two lower phase signals are in a predetermined state) used for a flash type ADC in time series, while changing the lower phase signal which is a comparison target. In detail, a method of detecting whether the logic states of the two lower phase signals are in a predetermined logic state, for example, "01" (L state and H state) is performed in time series. The encode method is applied to the TDC type AD conversion circuit using the asymmetric type oscillation circuit illustrated in FIG. 11.

The states (a combination of the logic states of each of the lower phase signals CK[0] to CK[15]) of the lower phase signals CK[0] to CK[15] latched by the latch unit 1108 become a total of 16 states, for example, state 0 to state 15 as illustrated in FIG. 10. When the counter 1105 counts at the rising edge of the lower phase signal CK[13], the combination of the logic states of the lower phase signals CK[0] to CK[15] in each period equally divided into sixteen from a period (a period from the rising edge of the lower phase signal CK[13] to the next rising edge) counted by one by the counter 1105 becomes state 0 to state 15. State 0 to state 15 correspond to encode values 0 to 15 which are the encode results.

Hereinafter, a process of detecting whether the logic states of the two lower phase signals are in a predetermined logic state (in the present example, "01") will be described. FIG. 11 illustrates waveforms of the start pulse StartP and the output signal (lower phase signals CK[0] to CK[15]) of the VCO 1100. In FIG. 11, the lower phase signals CK[0] to CK[15] illustrated in FIG. 10 are arranged so as to be a signal group which rises (changed from an L state to an H state) in order at a predetermined time interval. In detail, each lower phase signal is arranged in order of the lower phase signals CK[15], CK[0], CK[2], CK[4], CK[6], CK[8], CK[10], CK[12], CK[14], CK[1], CK[3], CK[5], CK[7], CK[9], CK[11], and CK[13].

As illustrated in FIG. 11, when the lower phase signal CK[15] is changed from an L state to an H state and then a predetermined time (corresponding to a delay time of the two NAND circuits) lapses, the lower phase signal CK[0] is changed from an L state to an H state. When the lower phase signal CK[0] is changed from an L state to an H state and then the predetermined time (corresponding to the delay time of the two NAND circuits) lapses, the lower phase signal CK[2] is changed from an L state to an H state.

After that, similarly, the lower phase signals CK[4], CK[6], CK[8], CK[10], CK[12], CK[14], CK[1], CK[3], CK[5], CK[7], CK[9], CK[11], and CK[13] are changed from an L state to an H state in series.

During the encoding of the lower phase signal, in a signal group (a signal sequence) in which the lower phase signals CK[15], CK[0], CK[2], CK[4], CK[6], CK[8], CK[10], CK[12], CK[14], CK[1], CK[3], CK[5], CK[7], CK[9], CK[11], and CK[13] latched by the latch unit 1108 are arranged in this order, the case in which the logic states of the two consecutive lower phase signals become an L state and an H state in order respectively is detected and encode values are determined depending on a position at which the logic states are detected.

FIG. 12 illustrates a correspondence relationship between the logic states of the lower phase signals latched by the latch unit 1108 and the encode values corresponding to the logic states of the lower phase signals. In FIG. 12, each lower phase signal is arranged so that the order thereof becomes the same as the order of each lower phase signal in FIG. 11. In detail, the order of each lower phase signal as seen from the top to the bottom in order in FIG. 11 is the same as the order of each lower phase signal as seen from the right to the left in order in FIG. 12.

In FIG. 12, "1," "0," and "1/0" represent the logic states of each lower phase signal. "1," "0," and "1/0" correspond to an "H state," an "L state," and an "H state or L state," respectively. The logic states of the lower phase signals input to the latch unit 1108 are changed in time series and the encode values corresponding to the timing latched by the latch unit 1108 are obtained.

In FIG. 12, the encode values are determined corresponding to a combination of the signals in which the logic states of the two consecutive lower phase signals become "0" and "1" in order respectively. For example, when the logic states of the lower phase signals CK[15] and CK[13] are "0" and "1" respectively, the encode value is "0" and when the logic states of the lower phase signals CK[0] and CK[15] are "0" and "1" respectively, the encode value is "1". Similarly, when the logic states of the lower phase signals CK[13] and CK[11] are "0" and "1" respectively, the encode value is "15."

In the above description, the lower phase signal CK[13] is a count clock of the counter 1105, but the present invention is not limited thereto and therefore any lower phase signal may be used as the count clock of the counter 1105. For example, when the lower phase signal CK[2] becomes the count clock of the counter 1105, a process of detecting whether the logic states of the two lower phase signals is a predetermined state (in the present example, "01") is as follows.

The states (the combination of the logic states of each of the lower phase signals CK[0] to CK[15]) of the lower phase signals CK[0] to CK[15] latched by the latch unit 1108 become a total of 16 states, for example, state 0 to state 15 as illustrated in FIG. 13. When the counter 1105 counts at the rising edge of the lower phase signal CK[2], the combination of the logic states of the lower phase signals CK[0] to CK[15] in each period equally divided into sixteen from a period (a period from the rising edge of the lower phase signal CK[2] to the next rising edge) counted by one by the counter 1105 becomes state 0 to state 15. State 0 to state 15 correspond to the encode values 0 to 15 which are the encode results.

FIG. 14 illustrates waveforms of the start pulse StartP and the output signal (lower phase signals CK[0] to CK[15]) of the VCO 1100. In FIG. 14, the lower phase signals CK[0] to CK[15] illustrated in FIG. 13 are arranged so as to be a signal group which rises (changed from an L state to an H state) in order at a predetermined time interval. In detail, each lower phase signal is arranged in order of the lower phase signals CK[4], CK[6], CK[8], CK[10], CK[12], CK[14], CK[1], CK[3], CK[5], CK[7], CK[9], CK[11], CK[13], CK[15], CK[0], and CK[2].

As illustrated in FIG. 14, when the lower phase signal CK[4] is changed from an L state to an H state and then the predetermined time (corresponding to the delay time of the two NAND circuits) lapses, the lower phase signal CK[6] is changed from an L state to an H state. When the lower phase signal CK[6] is changed from an L state to an H state and then the predetermined time (corresponding to the delay time of the two NAND circuits) lapses, the lower phase signal CK[8] is changed from an L state to an H state.

After that, similarly, the lower phase signals CK[10], CK[12], CK[14], CK[1], CK[3], CK[5], CK[7], CK[9], CK[11], CK[13], CK[15], CK[0], and CK[2] are changed from an L state to an H state in series.

During the encoding of the lower phase signals, in a signal group (a signal sequence) in which the lower phase signals CK[4], CK[6], CK[8], CK[10], CK[12], CK[14], CK[1], CK[3], CK[5], CK[7], CK[9], CK[11], CK[13], CK[15], CK[0], and CK[2] latched by the latch unit 1108 are arranged in this order, the case in which the logic states of the two consecutive lower phase signals become an L state and an H state in order respectively is detected and the encode values are determined depending on a position at which the logic states are detected.

FIG. 15 illustrates a correspondence relationship between the logic states of the lower phase signals latched by the latch unit 1108 and the encode values corresponding to the logic states of the lower phase signals. In FIG. 15, each lower phase signal is arranged so that the order thereof becomes the same as the order of each lower phase signal in FIG. 14. In detail, the order of each lower phase signal as seen from the top to the bottom in order in FIG. 14 is the same as the order of each lower phase signal as seen from the right to the left in order in FIG. 15.

In FIG. 15, "1," "0," and "1/0" represent the logic states of each lower phase signal. "1," "0," and "1/0" correspond to an "H state," an "L state," and an "H state or L state," respectively. The logic states of the lower phase signals input to the latch unit 1108 are changed in time series and the encode values corresponding to the timing latched by the latch unit 1108 are obtained.

In FIG. 15, the encode values are determined corresponding to the combination of the signals in which the logic states of the two consecutive lower phase signals become "0" and "1" in order respectively. For example, when the logic states of the lower phase signals CK[4] and CK[2] are "0" and "1" respectively, the encode value is "0" and when the logic states of the lower phase signals CK[6] and CK[4] are "0" and "1" respectively, the encode value is "1." Similarly, when the logic states of the lower phase signals CK[2] and CK[0] are "0" and "1" respectively, the encode value is "15."

In the TDC type AD conversion circuit including the asymmetric type oscillation circuit, like the lower phase signal CK[0] and the lower phase signal CK[15], a plurality of signals which substantially simultaneously falls (or rises) are present in principle.

Therefore, as will be described later, errors in lower data which are obtained by the encoding may occur.

Hereinafter, the case in which the lower phase signal CK[13] becomes the count clock of the counter 1105 will be described by way of example. As illustrated in FIG. 16, the logic states of the lower phase signals CK[0] and CK[15] may become "0" and "1" respectively in the case in which large noises overlap in a buffer etc. which transmits the lower phase signal CK[0] or the lower phase signal CK[15], thus the lower phase signals CK[0] to CK[15] are latched by the latch unit 1108 at the timing at which the phase of the lower phase signal CK[0] is advanced from the phase of the lower phase signal CK[15] and the like.

When the logic states of the lower phase signals CK[0] to CK[15] latched by the latch unit 1108 become as illustrated in FIG. 16, if encoded by using an encoding method of determining encode values depending on a position at which the logic states of the two consecutive lower phase signals become "0" and "1" in order respectively, the logic states of the lower phase signals CK[1] and CK[14] are detected as "0" and "1" and the logic states of the lower phase signals CK[0] and CK[15] are detected as "0" and "1." As such, if there are two positions at which the logic states of the two consecutive lower phase signals are in a predetermined logic state, the encode value is supposed to be "9" originally. However, the encode value may be "1." In this case, an error of "8" which is a difference between "9" and "1" occurs in the lower data.

Alternatively, even when the lower phase signal CK[2] becomes the count clock of the count unit 1105, in the case in which the lower phase signals CK[0] to CK[15] are latched by the latch unit 1108 at the timing at which the phase of the lower phase signal CK[0] is advanced from the phase of the lower phase signals CK[15] and the like, as illustrated in FIG. 17, the logic states of the lower phase signals CK[0] and CK[15] may be "0" and "1" respectively.

When the logic states of the lower phase signals CK[0] to CK[15] latched by the latch unit 1108 are as illustrated in FIG. 17, if encoded by using an encoding method of determining encode values depending on a position at which the logic states of the two consecutive lower phase signals are "0" and "1" in order respectively, the logic states of the lower phase signals CK[1] and CK[14] are detected as "0" and "1" and the logic states of the lower phase signals CK[0] and CK[15] are detected as "0" and "1." As such, if there are two positions at which the logic states of the two consecutive lower phase signals are in a predetermined logic state, the encode value is supposed to be "6" originally. However, the encode value may be "14. In this case, an error of "8" which is a difference between "6" and "14" occurs in the lower data.

SUMMARY OF THE INVENTION

According to a first aspect of the present invention, an AD conversion circuit includes: a reference signal generation unit configured to generate a reference signal which increases or decreases as time passes; a comparison unit configured to perform a comparison process in which an analog signal which is a target of AD conversion is compared with the reference signal, and to end the comparison process at a timing at which the reference signal satisfies a predetermined condition with respect to the analog signal; a clock generation unit including an oscillation circuit which includes n delay units, where n is an odd number of 3 or more, and having a first path to which a signal is transmitted through each of the n delay units and a second path to which a signal is transmitted to bypass some of the n delay units, and configured to output a lower phase signal including signals output from the delay units; a latch unit configured to latch the lower phase signal at a timing associated with the ending of the comparison process; a counter which includes a counter circuit configured to count based on a predetermined signal among the signals output from the delay units to obtain an upper count value; and an encoding unit configured to perform an operation of detecting logic states of m lower phase signals, where m is a natural number of 2 or more, in a signal group that a plurality of lower phase signals latched by the latch unit are arranged, while selecting the m lower phase signals in a predetermined order so that the order thereof becomes the same as the order of the signal group when the lower phase signal output from the clock generation unit during the comparison process is arranged so as to be a signal group which rises in order at a predetermined time interval or falls in order at a predetermined time interval using the predetermined signal as a reference, output a state detection signal at the time of detecting that the logic states of the m lower phase signals are in a predetermined logic state in the detection operation, and encode based on the state detection signal, wherein the predetermined order is defined depending on the predetermined signal and an encoding method employed in the encoding unit.

In addition, according to a second aspect of the present invention, the encoding method is an encoding method which determines an encode value based on the state detection signal initially output when the state detection signals are output a plurality of times.

In addition, according to a third aspect of the present invention, the encoding method is an encoding method which determines an encode value based on the state detection signal finally output when the state detection signals are output a plurality of times.

Further, according to a fourth aspect of the present invention, a solid-state imaging apparatus includes: an imaging unit which includes a plurality of pixels outputting pixel signals disposed in a matrix configuration; and the AD conversion circuit according to any one of the first to third aspects which receives analog signals corresponding to the pixel signals, wherein the pixels include a photoelectric conversion element, and the comparison unit, the latch unit, the counter, and the encoding unit included in the AD conversion circuit are disposed in every column or plurality of columns of an arrangement of pixels of the imaging unit.

BRIEF DESCRIPTION OF THE DRAWINGS

FIG. 12 is a reference diagram illustrating a correspondence relationship between logic states of the lower phase signals latched by a latch unit and encode values corresponding to the logic states of the lower phase signals.

FIG. 15 is a reference diagram illustrating a correspondence relationship between logic states of the lower phase signals latched by the latch unit and encode values corresponding to the logic states of the lower phase signals.

FIG. 16 is a reference diagram illustrating a correspondence relationship between logic states of the lower phase signals latched by the latch unit and encode values corresponding to the logic states of the lower phase signals.

FIG. 17 is a reference diagram illustrating a correspondence relationship between logic states of the lower phase signals latched by the latch unit and encode values corresponding to the logic states of the lower phase signals.

DETAILED DESCRIPTION OF THE INVENTION

Hereinafter, embodiments of the present invention will be described with reference to the accompanying drawings.

First Embodiment

Figure 1:
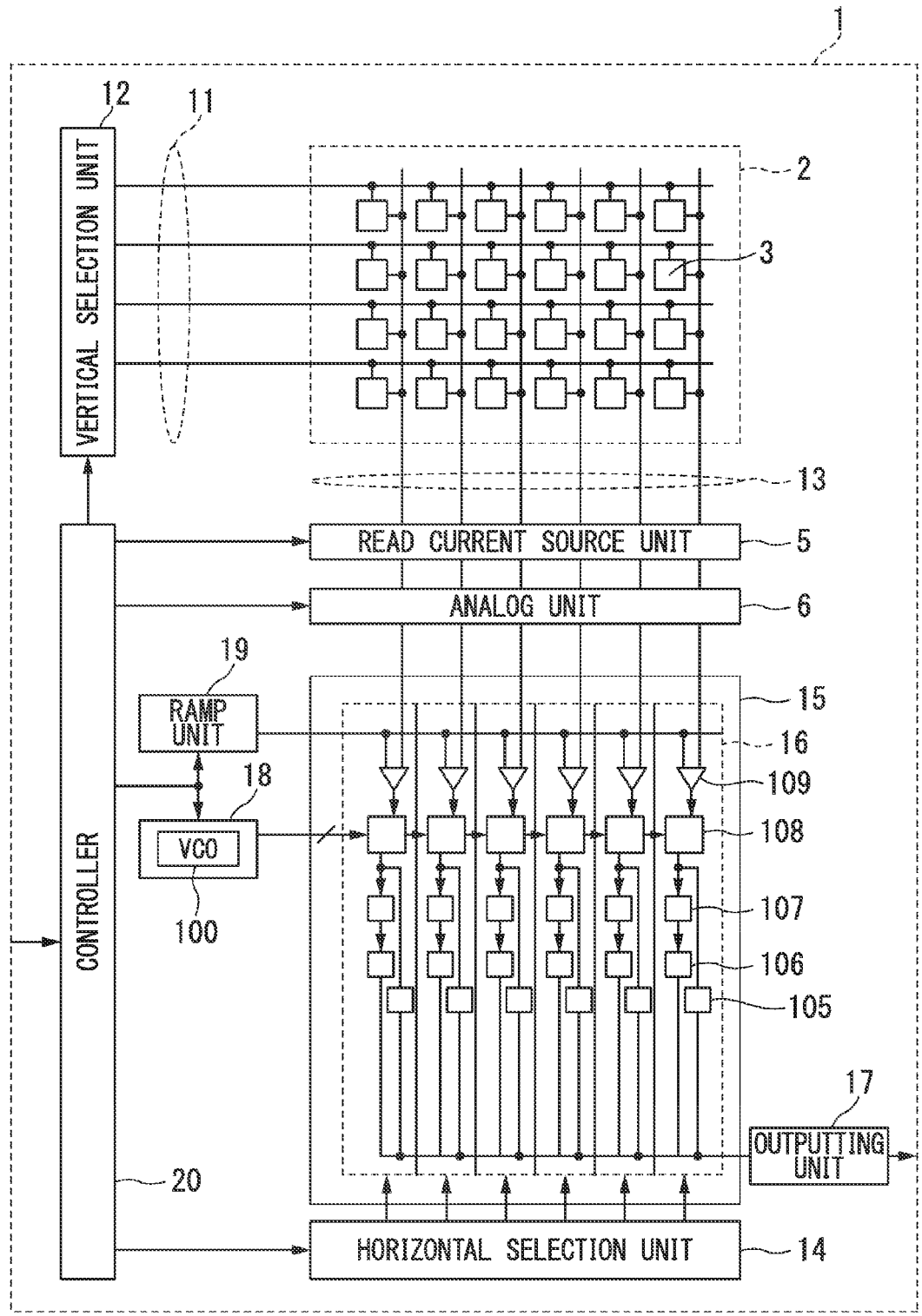
FIG. 1 is a block diagram illustrating a constitution of a solid-state imaging apparatus according to a first embodiment of the present invention.

First, a first embodiment of the present invention will be described. FIG. 1 illustrates an example of a constitution of a solid-state imaging apparatus according to the first embodiment of the present invention. A solid-state imaging apparatus 1 illustrated in FIG. 1 includes an imaging unit 2, a vertical selection unit 12, a read current source unit 5, an analog unit 6, a clock generation unit 18, a ramp unit 19 (a reference signal generation unit), a column processing unit 15, a horizontal selection unit 14, an outputting unit 17, and a controller 20.

The imaging unit 2 includes a plurality of unit pixels 3 which are arranged in a matrix type to generate and output signals corresponding to an amount of an incident electromagnetic wave. The vertical selection unit 12 selects each row of the imaging unit 2. The read current source unit 5 reads a signal from the imaging unit 2 as a voltage signal. The analog unit 6 performs analog processing on a pixel signal read by the imaging unit 2. The clock generation unit 18 generates and outputs a clock signal with a predetermined frequency. The ramp unit 19 generates a reference signal (a ramp wave) which increases or decreases as time passes. The column processing unit 15 is connected with the ramp unit 19 through a reference signal line. The horizontal selection unit 14 reads AD converted data to a horizontal signal line. The outputting unit 17 is connected with the horizontal signal line. The controller 20 controls each unit.

For convenience of description, the imaging unit 2 in which unit pixels 3 of 4 rows×6 columns are formed is described in FIG. 1, but in practice, each row or each column of the imaging unit 2 is arranged with tens to hundreds of thousands of unit pixels 3. Although not illustrated in the drawing, the unit pixel 3 constituting the imaging unit 2 includes a photoelectric conversion element, such as a photo diode, a photo gate, a photo transistor or the like, and a transistor circuit.

Hereinafter, each unit will be described in more detail. The imaging unit 2 includes the unit pixel 3 in which only 4 rows×6 columns are arranged two-dimensionally and row control lines 11 which are wired relative to each row in the 4 rows×6 columns pixel arrangement. Each end of the row control lines 11 is connected with each output terminal corresponding to each row of the vertical selection unit 12.

The vertical selection unit 12 includes a shift register, a decoder, or the like, and at the time of driving each unit pixel 3 of the imaging unit 2, controls a row address and row scanning of the imaging unit 2 through the row control lines 11. Further, vertical signal lines 13 are wired relative to each column in the pixel arrangement of the imaging unit 2.

The read current source unit 5 includes, for example, an NMOS transistor. The NMOS transistor constituting the read current source unit 5 includes a drain terminal connected with the vertical signal line 13 from the imaging unit 2, a gate terminal applied with a desired voltage, and a source terminal connected with a GND. Thus, a signal from the unit pixel 3 is output as a voltage mode. The case in which the NMOS transistor is used as a current source is described, but the present invention is not necessarily limited thereto.

Although the detailed description is omitted, the analog unit 6 performs a process of obtaining a difference between a signal level (a reset level) immediately after a pixel is reset and a true signal level on a pixel signal of the voltage mode input through the vertical signal line 13, thereby removing variation fixed pattern noises (FPN) for each pixel and noise components referred to as reset noises. If necessary, the analog unit 6 may include an auto gain control (AGC) circuit having a signal amplification function and the like.

The column processing unit 15 includes column AD conversion units 16 which are disposed, for example, for each pixel column of the imaging unit 2, that is, for each vertical signal line 13 and converts analog pixel signals read through the vertical signal lines 13 for each pixel column from each unit pixel 3 of the imaging unit 2 into digital data. In the present example, a constitution in which the column AD conversion units 16 are disposed to have one-to-one correspondence relationship with the pixel columns of the imaging unit 2, but it is only one example and the present invention is not limited to this relationship. For example, a constitution in which one column AD conversion unit 16 is disposed for a plurality of pixel columns and the one column AD conversion unit 16 is used to perform in the time division between the plurality of pixel columns may also be adopted. The column processing unit 15 constitutes an analog-to-digital conversion unit (an AD conversion circuit) which converts the analog pixel signals read from the unit pixel 3 of a selection pixel row of the imaging unit 2 into digital pixel data, along with the ramp unit 19 and the clock generation unit 18 which will be described later.

The ramp unit 19 includes, for example, an integration circuit and generates a so-called ramp wave of which a level is changed to an inclined pattern as time passes and supplies the ramp wave to one of the input terminals of a comparison unit 109 through the reference signal line, by the control of the controller 20. The present invention is not limited to the constitution of using the integration circuit as the ramp unit 19, but a DAC circuit may also be used. However, to adopt a constitution of digitally generating the ramp wave using the DAC circuit, it is necessary to make a step of the ramp wave fine or adopt a constitution equivalent thereto.

The horizontal selection unit 14 includes a shift register, a decoder, or the like, and controls the column address and the column scanning of the column AD conversion unit 16 of the column processing unit 15. According to the control of the horizontal selection unit 14, the digital data which are AD-converted by the column AD conversion unit 16 are read to the horizontal signal lines in order.

The clock generation unit 18 includes a VCO 100 which is a ring delay circuit in which a plurality of delay units (inversion elements) is connected in a ring shape. Like the VCO 1100 illustrated in FIG. 11, the VCO 100 is a so-called "asymmetric type oscillation circuit" which includes an odd number of delay units. This is only one example and therefore the present invention is not limited to the above constitution. A signal output by the delay unit included in the VCO 100 constitutes a lower phase signal to be described later.

The outputting unit 17 outputs binarized digital data. Further, the outputting unit 17 may incorporate, for example, a signal processing function, such as black level adjustment, column variation correction, and color processing, in addition to a buffering function. Further, the outputting unit 17 may convert and output n-bit parallel digital data into serial data.

The controller 20 includes a function block of a timing generator (TG) which supplies a clock and a predetermined timing pulse signal necessary for operating each unit such as the ramp unit 19, the clock generation unit 18, the vertical selection unit 12, the horizontal selection unit 14, the outputting unit 17, and the like, and a function block for communicating with the TG.

Next, a constitution of the column AD conversion unit 16 will be described. The column AD conversion unit 16 compares the analog pixel signals read through the vertical signal line 13 from each unit pixel 3 of the imaging unit 2 with the ramp wave for AD-conversion supplied from the ramp unit 19 to generate a pulse signal having a size (a pulse width) in a time axis direction corresponding to the magnitude of the pixel signal. Further, the AD conversion is performed by making the data corresponding to a period of the pulse width of the pulse signal into the digital data corresponding to the magnitude of the pixel signal.

Hereinafter, the constitution of the column AD conversion unit 16 will be described in detail. The column AD conversion unit 16 is disposed in each column. In FIG. 1, six-column AD conversion units 16 are disposed. The column AD conversion units 16 in each column have the same constitution. The column AD conversion unit 16 includes the comparison unit 109, a latch unit 108, a counter 105, a detection circuit 107, and an encoding circuit 106.

The comparison unit 109 compares a signal voltage corresponding to the analog pixel signal output through the vertical signal line 13 from the unit pixel 3 of the imaging unit 2 with a ramp voltage of the ramp wave supplied from the ramp unit 19 to convert the magnitude of the pixel signal into information (the pulse width of the pulse signal) in the time axis direction. A comparison output CO of the comparison unit 109 becomes a low level (L level), for example, when the ramp voltage is larger than the signal voltage and becomes a high level (H level) when the ramp voltage is the signal voltage or less.

The latch unit 108 includes a latch circuit which latches (holds/stores) lower phase signals CK[0] to CK[15] output from the VCO 100. The latch unit 108 outputs one (in the present example, a lower phase signal CK[13] or a lower phase signal CK[2]) of the lower phase signals output from the VCO 100 to the counter 105 as it is until the comparison output CO of the comparison unit 109 is inverted. Further, the latch unit 108 latches the lower phase signals CK[0] to CK[15] output from the VCO 100 at the timing at which the comparison output CO of the comparison unit 109 is inverted.

The counter 105 includes a counter circuit which counts the one lower phase signal (in the present example, the lower phase signal CK[13] or the lower phase signal CK[2]) output through the latch unit 108 as a count clock to obtain a count value (an upper count value). The counter 105 counts to obtain upper bit data (upper data) constituting the digital data.

Herein, the lower phase signal latched by the latch unit 108 is, for example, 16-bit data. In addition, the upper data signal constituted by a count value of the counter 105 is, for example, 8-bit data. The 8 bit is one example and therefore, a bit number (for example, 10 bits) exceeding the 8 bit, and the like, may be used.

The detection circuit 107 compares two lower phase signals latched by the latch circuit of the latch unit 108 to detect a predetermined logic state and output the detected result. The encoding circuit 106 encodes based on the detected result output from the detection circuit 107 and determines the encode value. Therefore, the lower bit data (lower data) constituting the digital data by encoding the lower phase signal are obtained. The detailed encode method will be described later.

Next, an operation of the present example will be described. Herein, a description of a detailed operation of the unit pixel 3 is omitted, but as known in the art, a reset level and a signal level are output from the unit pixel 3.

The AD conversion is performed as follows. For example, in a period from when a comparison process for comparing the voltage of the ramp wave which falls at a predetermined slope and the voltage of the analog signals from the analog unit 6 starts to when the voltages of the analog signals coincide with the voltage (the ramp voltage) of the ramp wave, the counter 105 counts the lower phase signals output through the latch unit 108, the detection circuit 107 detects the logic state of the lower phase signals latched by the latch unit 108, and the encoding circuit 106 encodes the detected result, thereby obtaining the digital data corresponding the magnitude of the analog signal.

First, after the pixel signal output to the vertical signal line 13 from the unit pixel 3 of any pixel row is stabilized, the controller 20 supplies control data of the ramp wave generation to the ramp unit 19. The ramp unit 19 receives the control data and thus outputs the ramp wave of which the entire waveform is temporally changed into the ramp shape as the comparison voltage supplied to one input terminal of the comparison unit 109. The comparison unit 109 compares the ramp wave with the analog signal from the analog unit 6. During the period, the counter 105 counts the lower phase signal CK[13] or the lower phase signal CK[2] output from one latch circuit of the latch unit 108 as the count clock. It is preferable that an output start timing of the lower phase signal of the clock generation unit 18 and an output start timing of the ramp wave are substantially the same, but the present invention is not limited thereto.

The comparison unit 109 compares the ramp wave supplied from the ramp unit 19 with the analog signal from the analog unit 6 and when the voltages thereof coincide with each other, inverts the comparison output CO. The latch circuit of the latch unit 108 becomes a disable state at the timing, such that the latch unit 108 latches the logic states of the lower phase signals CK[0] to CK[15] output from the clock generation unit 18. Further, the counter 105 latches the count value by allowing the latch circuit of the latch unit 108 to stop the output of the lower phase signal CK[13] or the lower phase signal CK[2]. The controller 20 stops the supply of the control data to the ramp unit 19 and the output of the lower phase signal from the clock generation unit 18 when a predetermined period lapses. Thus, the ramp unit 19 stops the generation of the ramp wave.

Next, the lower phase signals CK[0] to CK[15] held in the latch unit 108 are encoded and the encode value is latched to the encoding circuit 106. Further, the encode value latched to the encode circuit 106 and the count value latched to the counter 105 are transmitted to the outputting unit 17 through the horizontal signal line by the horizontal selection unit 14.

The reset level may be read by a first reading operation from each unit pixel 3 of the selected row of the imaging unit 2 and AD-converted, and then, the signal level may be read by a second reading operation, AD-converted, and subjected to digitally correlated double sampling (CDS) processing, thereby obtaining the digital data corresponding to the pixel signal. Further, the present invention is not necessarily limited thereto.

Figure 2:
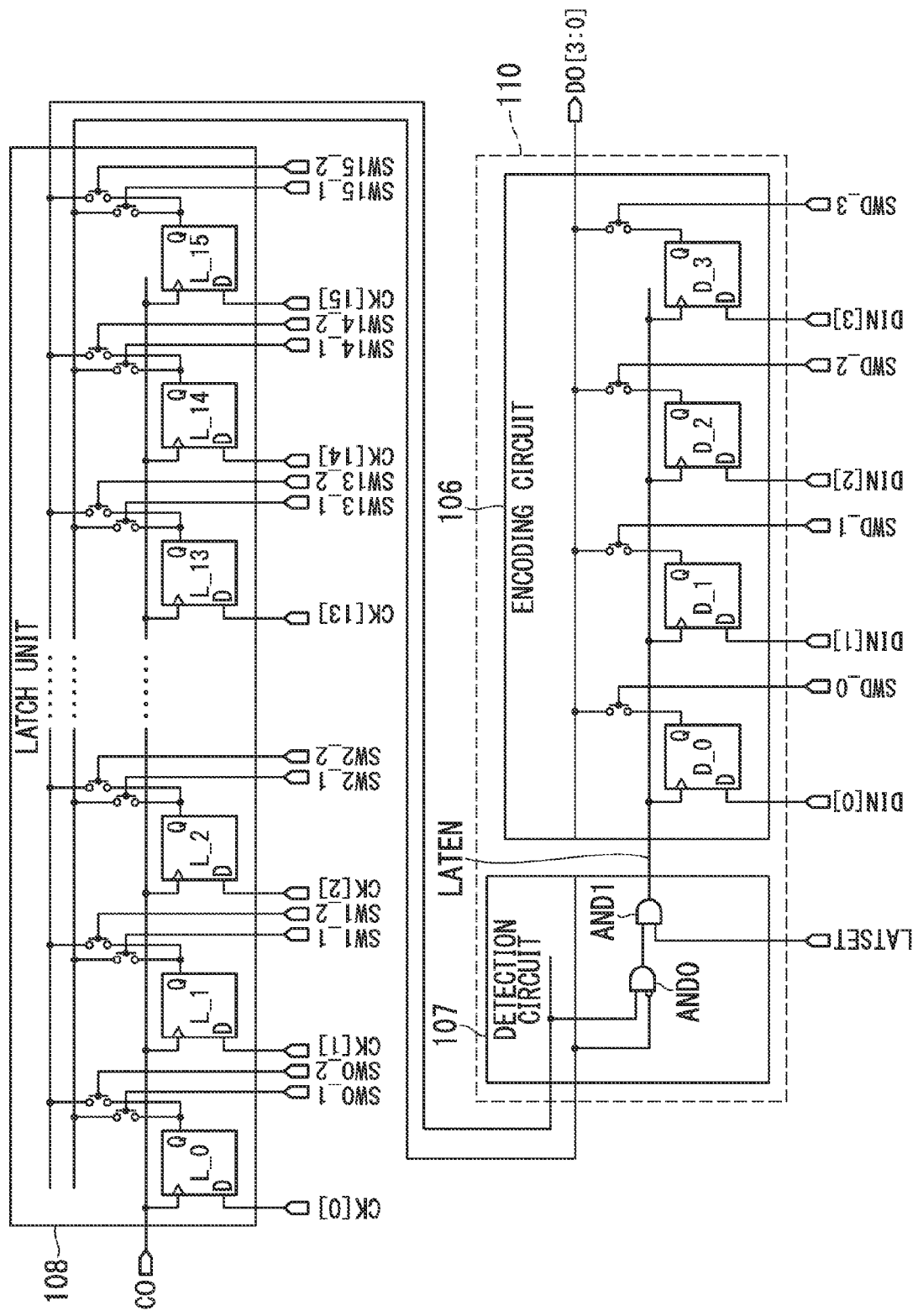
FIG. 2 is a circuit diagram illustrating a constitution of a latch unit, a detection circuit, and an encoding circuit constituting a column AD conversion unit included in the solid-state imaging apparatus according to the first embodiment of the present invention.

Next, the latch unit 108, the detection circuit 107, and the encoding circuit 106 will be described in detail. FIG. 2 illustrates a constitution of the latch unit 108, the detection circuit 107, and the encoding circuit 106.

The latch unit 108 includes latch circuits L_0 to L_15 which latch the logic states of the lower phase signals CK[0] to CK[15] at the time when the comparison output CO from the comparison unit 109 is inverted. Control signals SW0_1 to SW15_1 and SW0_2 to SW15_2 are signals controlling a switch for outputting a desired lower phase signal to the detection circuit 107 from the lower phase signals CK[0] to CK[15] latched to the latch circuits L_0 to L_15.

The detection circuit 107 includes AND circuits AND0 and AND1. The lower phase signal output from any one of the latch circuits L_0 to L_15 and an inversion signal of the lower phase signal output from the other any one of the latch circuits L_0 to L_15 are input to the AND circuit AND0. The AND circuit AND0 performs an AND operation on the two input signals. An output signal of the AND circuit AND0 and a control signal LATSET are input to the AND circuit AND1. The AND circuit AND1 performs the AND operation on the two input signals and outputs the operation result as a detection result LATEN (a state detection signal) of a predetermined logic state.

The encode circuit 106 includes latch circuits D_0 to D_3 for encoding. Encode values DIN[0] to DIN[3] are sequentially changed depending on a combination of the two lower phase signals which are sequentially compared by the detection circuit 107. The encode values DIN[0] to DIN[3] input to the encode circuit 106 are changed every time the combination of the two lower phase signals input to the detection circuit 107 is changed and the encode values DIN[0] to DIN [3] are held as the encode result of the lower phase signals CK[0] to CK[15] when the predetermined logic state is detected and is output as output signals DO[0] to DO[3]. Control signals SWD_0 to SWD_3 are signals controlling the switch for outputting the encode value from the latch circuits D_0 to D_3. The detection circuit 107 and the encode circuit 106 constitutes the encoding unit 110. These are only one example and therefore the present invention is not necessarily limited thereto.

Next, an operation of the detection circuit 107 and the encoding circuit 106 will be described. Hereinafter, the case (a first operation example) in which the lower phase signal CK[13] becomes the count clock of the counter 105 and the case (a second operation example) in which the lower phase signal CK[2] becomes the count clock of the counter 105 will be described by way of example.

(1) First Operation Example

The Case in which the Lower Phase Signal CK[13] Becomes the Count Clock of the Counter 105

Figure 11:
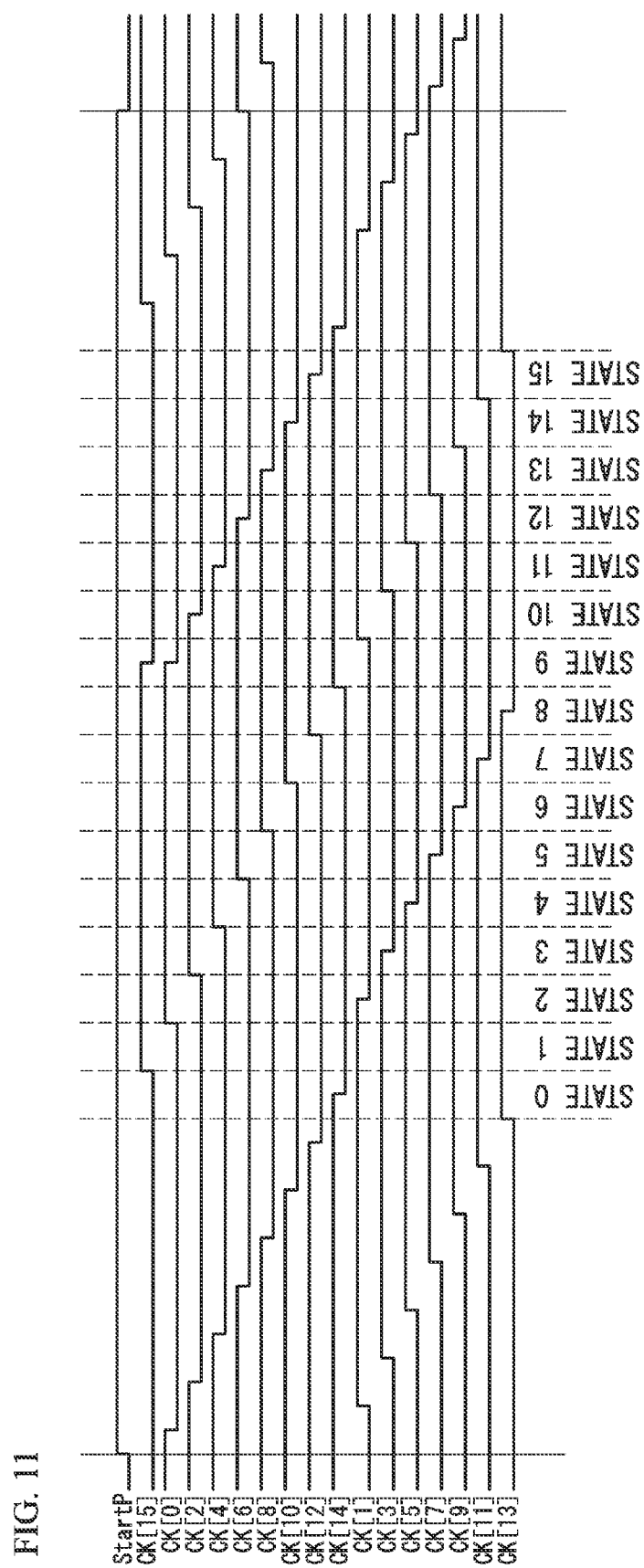
FIG. 11 is a timing chart illustrating waveforms of lower phase signals.
Figure 13:
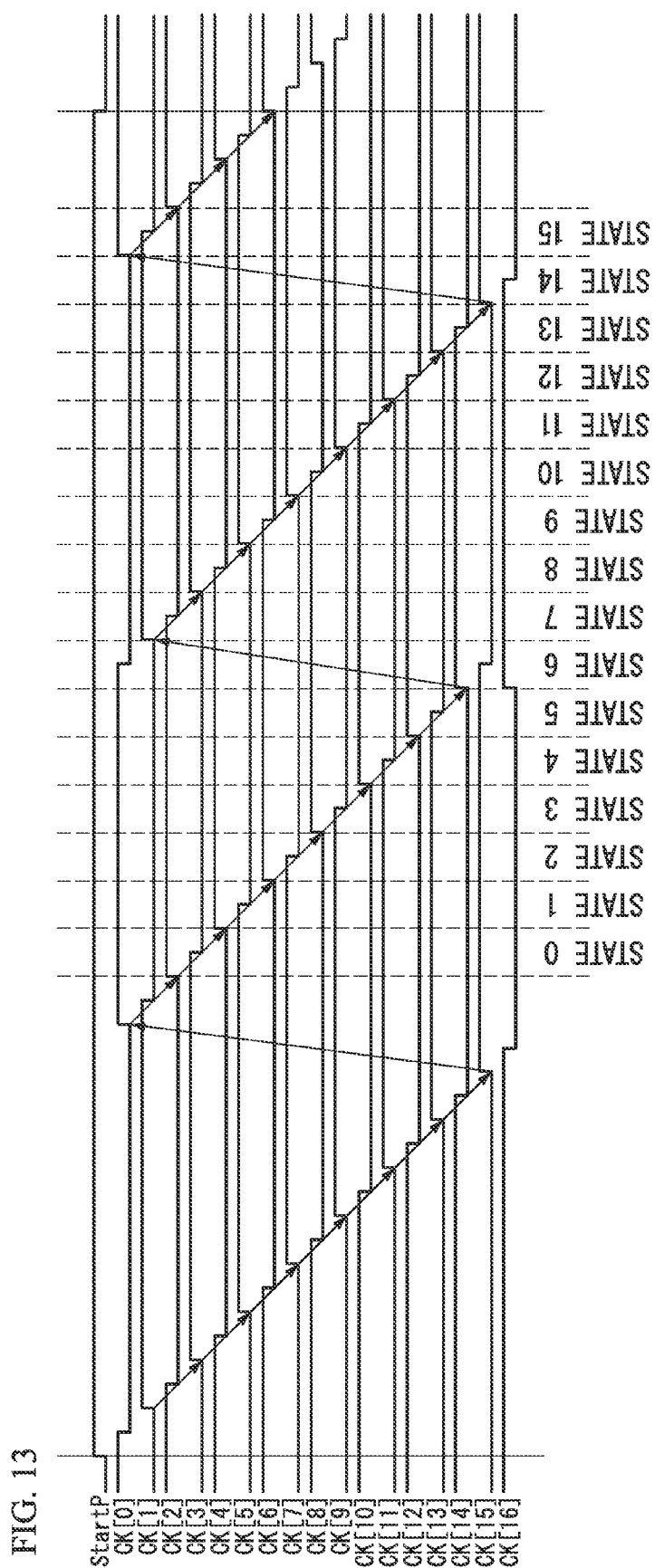
FIG. 13 is a timing chart illustrating waveforms of lower phase signals.

In the present embodiment, as illustrated in FIG. 11, in the signal group (the signal sequence) in which the lower phase signals CK[15], CK[0], CK[2], CK[4], CK[6], CK[8], CK[10], CK[12], CK[14], CK[1], CK[3], CK[5], CK[7], CK[9], CK[11], and CK[13] latched by the latch unit 108 are arranged in this order, the case in which the logic states of the two lower phase signals become an L state and an H state in order respectively is detected and the encode values are determined depending on a position at which the logic states are detected. The specific input order of the two lower phase signals detecting the logic states to the detection circuit 107 will be described later.

By the control signals SW0_1 to SW15_1 and SW0_2 to SW15_2, the lower phase signals are input to the detection circuit 107 from the two latch circuits selected from the latch circuit L_0 to L_15 in which the lower phase signals CK[0] to CK[15] are held and the logic states of the input lower phase signals are detected. When the result of the AND operation by the AND circuit AND0 becomes an H state, the encode values DIN[0] to DIN[3] input to the encoding circuit 106 become the encode results.

Hereinafter, the case in which the states of the lower phase signals CK[0] to CK[15] latched by the latch unit 108 is "state 9" will be described by way of example. In the case of the present example, the lower phase signal CK[0] and the lower phase signal CK[15] substantially simultaneously falls. Therefore, when the lower phase signal state latched by the latch unit 108 is "state 9," as illustrated in FIG. 16, the possibility of detecting that the logic states of the lower phase signals CK[1] and CK[14] are "0" and "1," and the logic states of the lower phase signals CK[0] and CK[15] are "0" and "1" may be considered.

The detection order of the logic states of the two lower phase signals (a selection order of the two lower phase signals input to the detection circuit 107) by the detection circuit 107 is an order defined depending on the lower phase signal which becomes the counter clock of the counter 105 and the encode method. The lower phase signal which becomes the count clock of the counter 105 is the lower phase signal CK[13]. In addition, the encode method is a method of detecting that the logic states of the two consecutive lower phase signals become an L state and an H state in order respectively and determining the encode value based on the finally detected timing when the logic states are detected twice or more.

The detection order of the logic states of the two lower phase signals by the detection circuit 107 basically depends on the order of the lower phase signals CK[0] to CK[15] that the lower phase signals CK[0] to CK[15] are rearranged using the lower phase signals which become the count clock of the counter 105 as a reference. However, since the predetermined logic state is detected multiple times in the encode procedure due to the presence of the timing when the lower phase signals CK[0] and CK[15] substantially simultaneously falls, the above order is changed based on whether the encode value is determined on the basis of any one of the plural timings at which the predetermined logic state is detected. In the present embodiment, in order to prevent errors from occurring in the lower data, the operation of detecting the logic states of at least lower phase signals CK[0] and CK[15] is performed prior to performing the operation of detecting the logic states of the lower phase signals CK[1] and CK[14].

Figure 3:
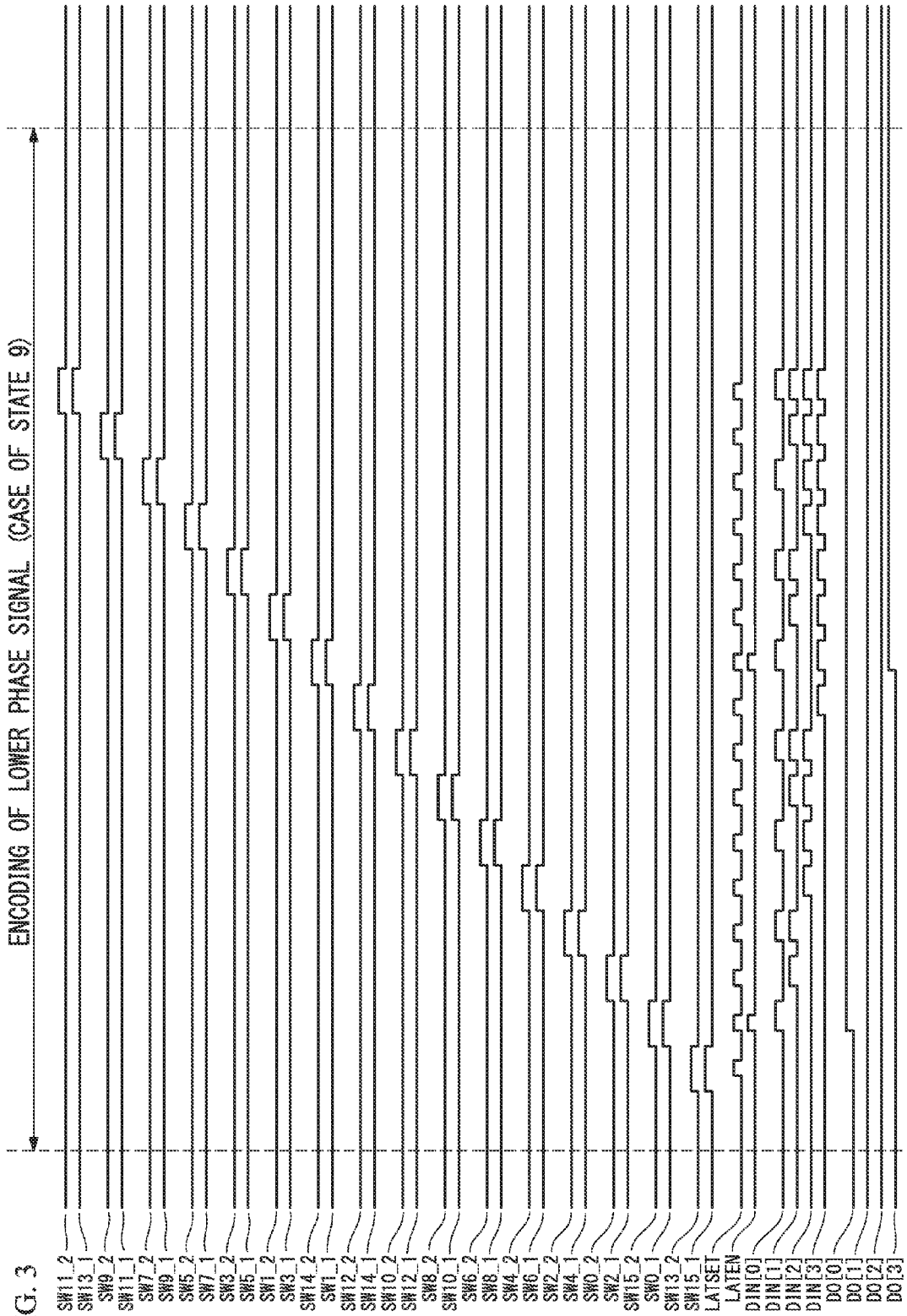
FIG. 3 is a timing chart illustrating an operation of the latch unit, the detection circuit, and the encoding circuit constituting the column AD conversion unit included in the solid-state imaging apparatus according to the first embodiment of the present invention.

Hereinafter, the encode procedure will be described with reference to FIG. 3. FIG. 3 illustrates waveforms of each signal associated with the operation of the detection circuit 107 and the encoding circuit 106.

<<Encode Procedure>>

<Procedure (1)>

First, when the control signals SW15_1 and SW13_2 become an H state, an inversion signal (L state) of the output signal (H state) of the latch circuit L_15 and the output signal (L state) of the latch circuit L_13 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, an output signal DO[3:0] of the encode circuit 106 is 4'b0000. "4'b" represents that the output signal is a binary number of 4 bits and "0000" represents the output of the latch circuits D_0 to D_3 within the encode circuit 106.

<Procedure (2)>

Next, when the control signals SW0_1 and SW15_2 become an H state, an inversion signal (H state) of the output signal (L state) of the latch circuit L_0 and the output signal (H state) of the latch circuit L_15 are input to the AND circuit AND0. Thus, the output signal of the AND circuit AND0 becomes an H state. Next, the control signal LATSET is changed from an L state to an H state and then becomes an L state. Thus, the detection result LATEN is changed from an L state to an H state and then becomes an L state. In this case, the encode value DIN[3:0]=4'b0001 is held in the encode circuit 106. At this time, the output signal DO[3:0] of the encode circuit 106 is 4'b0001.

<Procedure (3)>

Next, when the control signals SW2_1 and SW0_2 become an H state, an inversion signal (L state) of the output signal (H state) of the latch circuit L_2 and the output signal (L state) of the latch circuit L_0 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0001.

<Procedure (4)>

Next, when the control signals SW4_1 and SW2_2 become an H state, an inversion signal (L state) of the output signal (H state) of the latch circuit L_4 and the output signal (H state) of the latch circuit L2 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0001.

<Procedure 5)>

Next, when the control signals SW6_1 and SW4_2 become an H state, an inversion signal (L state) of the output signal (H state) of the latch circuit L_6 and the output signal (H state) of the latch circuit L_4 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0001.

<Procedure (6)>

Next, when the control signals SW8_1 and SW6_2 become an H state, an inversion signal (L state) of the output signal (H state) of the latch circuit L_8 and the output signal (H state) of the latch circuit L_6 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0001.

<Procedure (7)>

Next, when the control signals SW10_1 and SW8_2 become an H state, an inversion signal (L state) of the output signal (H state) of the latch circuit L_10 and the output signal (H state) of the latch circuit L_8 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0001.

<Procedure (8)>

Next, when the control signals SW12_1 and SW10_2 become an H state, an inversion signal (L state) of the output signal (H state) of the latch circuit L_12 and the output signal (H state) of the latch circuit L_10 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0001.

<Procedure (9)>

Next, when the control signals SW14_1 and SW12_2 become an H state, an inversion signal (L state) of the output signal (H state) of the latch circuit L_14 and the output signal (H state) of the latch circuit L_12 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0001.

<Procedure (10)>

Next, when the control signals SW1_1 and SW14_2 become an H state, an inversion signal (H state) of the output signal (L state) of the latch circuit L_1 and the output signal (H state) of the latch circuit L_14 are input to the AND circuit AND0. Thus, the output signal of the AND circuit AND0 becomes an H state. Next, the control signal LATSET is changed from an L state to an H state and then becomes an L state. Thus, the detection result LATEN is changed from an L state to an H state and then becomes an L state. In this case, the encode value DIN[3:0]=4'b1001 is held in the encode circuit 106. At this time, the output signal DO[3:0] of the encoding circuit 106 is 4'b1001.

<Procedure (11)>

Next, when the control signals SW3_1 and SW1_2 become an H state, an inversion signal (H state) of the output signal (L state) of the latch circuit L_3 and the output signal (L state) of the latch circuit L_1 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1001.

<Procedure (12)>

Next, when the control signals SW5_1 and SW3_2 become an H state, an inversion signal (H state) of the output signal (L state) of the latch circuit L_5 and the output signal (L state) of the latch circuit L_3 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1001.

<Procedure (13)>

Next, when the control signals SW7_1 and SW5_2 become an H state, an inversion signal (H state) of the output signal (L state) of the latch circuit L_7 and the output signal (L state) of the latch circuit L_5 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1001.

<Procedure (14)>

Next, when the control signals SW9_1 and SW7_2 become an H state, an inversion signal (H state) of the output signal (L state) of the latch circuit L_9 and the output signal (L state) of the latch circuit L_7 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1001.

<Procedure (15)>

Next, when the control signals SW11_1 and SW9_2 become an H state, an inversion signal (H state) of the output signal (L state) of the latch circuit L_11 and the output signal (L state) of the latch circuit L_9 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1001.

<Procedure (16)>

Finally, when the control signals SW13_1 and SW11_2 become an H state, an inversion signal (H state) of the output signal (L state) of the latch circuit L_13 and the output signal (L state) of the latch circuit L_11 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1001. Thus, the encode value D0[3:0]=4'b1001 corresponding to "state 9" is determined.

In the above procedures, in the procedure (2), the case in which the logic states of the lower phase signals CK[0] and CK[15] are "0" and "1" is detected, but at this time, the encode value is not determined, and in the procedure (10) which is after the procedure (2), the case in which the logic states of the lower phase signals CK[1] and CK[14] are "0" and "1" is detected, such that the encode value corresponding to "state 9" is determined. Thus, the occurrence of errors in the lower data may be avoided.

By using the above procedure, when the lower phase signal CK[13] becomes the count clock of the counter 105, the encode of "state 9" based on the lower phase signals CK[0] to CK[15] latched by the latch unit 108 may be made at the timing at which the lower phase signals CK[0] and CK[15] substantially simultaneously falls. Even when the lower phase signal state is a state other than "state 9," the encoding may be performed by the above procedures.

(2) Second Operation Example

The Case in which the Lower Phase Signal CK[2] Becomes the Count Clock of the Counter 105

Figure 14:
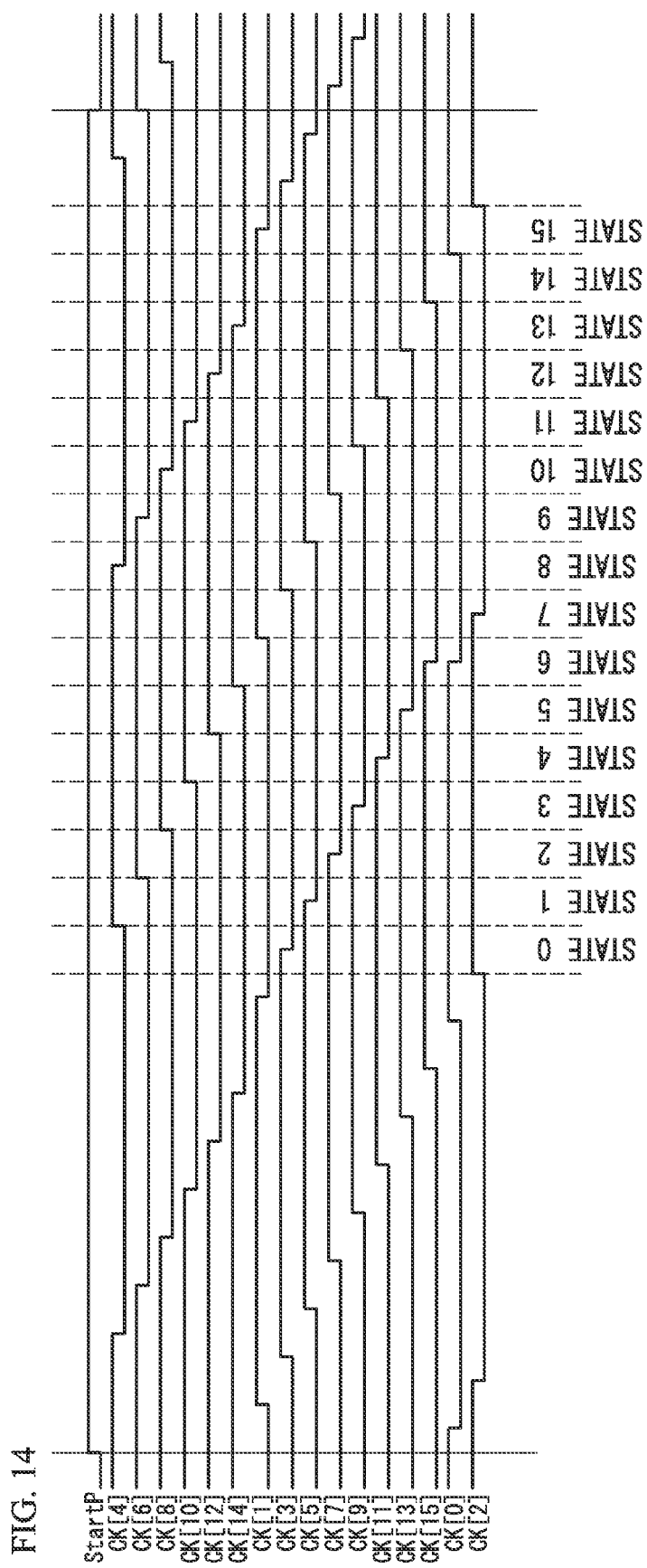
FIG. 14 is a timing chart illustrating waveforms of lower phase signals.

In the present embodiment, as illustrated in FIG. 14, in the signal group (the signal sequence) in which the lower phase signals CK[4], CK[6], CK[8], CK[10], CK[12], CK[14], CK[1], CK[3], CK[5], CK[7], CK[9], CK[11], CK[13], CK[15], CK[0], and CK[2] latched by the latch unit 108 are arranged in this order, the case in which the logic states of the two lower phase signals become an L state and an H state in order respectively is detected and the encode values are determined depending on a position at which the logic states are detected. The specific input order of the two lower phase signals detecting the logic states to the detection circuit 107 will be described later.

By the control signals SW0_1 to SW15_1 and SW0_2 to SW15_2, the lower phase signals are input to the detection circuit 107 from the two latch circuits selected from the latch circuit L_0 to L_15 in which the lower phase signals CK[0] to CK[15] are held and the logic states of the input lower phase signals are detected. When the result of the AND operation by the AND circuit AND0 becomes an H state, the encode values DIN[0] to DIN[3] input to the encoding circuit 106 become the encode results.

Hereinafter, the case in which the states of the lower phase signals CK[0] to CK[15] latched by the latch unit 108 is "state 6" will be described by way of example. Even in the case of the present embodiment, the lower phase signal CK[0] and the lower phase signal CK[15] substantially simultaneously falls. Therefore, when the lower phase signal state latched by the latch unit 108 is "state 6," as illustrated in FIG. 17, the possibility of detecting that the logic states of the lower phase signals CK[1] and CK[14] are "0" and "1" and the logic states of the lower phase signals CK[0] and CK[15] are "0" and "1" may be considered.

Similar to the first operation example, the detection order of the logic states of the two lower phase signals (the selection order of the two lower phase signals input to the detection circuit 107) by the detection circuit 107 is an order defined depending on the lower phase signal which becomes the counter clock of the counter 105 and the encode method. The lower phase signal which becomes the count clock of the counter 105 is the lower phase signal CK[2]. In addition, the encode method is a method of detecting that the logic states of the two consecutive lower phase signals become an L state and an H state in order respectively and determining the encode value based on the finally detected timing when the logic states are detected twice or more. In the present embodiment, in order to prevent errors from occurring in the lower data, the operation of detecting the logic states of at least lower phase signals CK[0] and CK[15] is performed prior to performing the operation of detecting the logic states of the lower phase signals CK[1] and CK[14].

Figure 4:
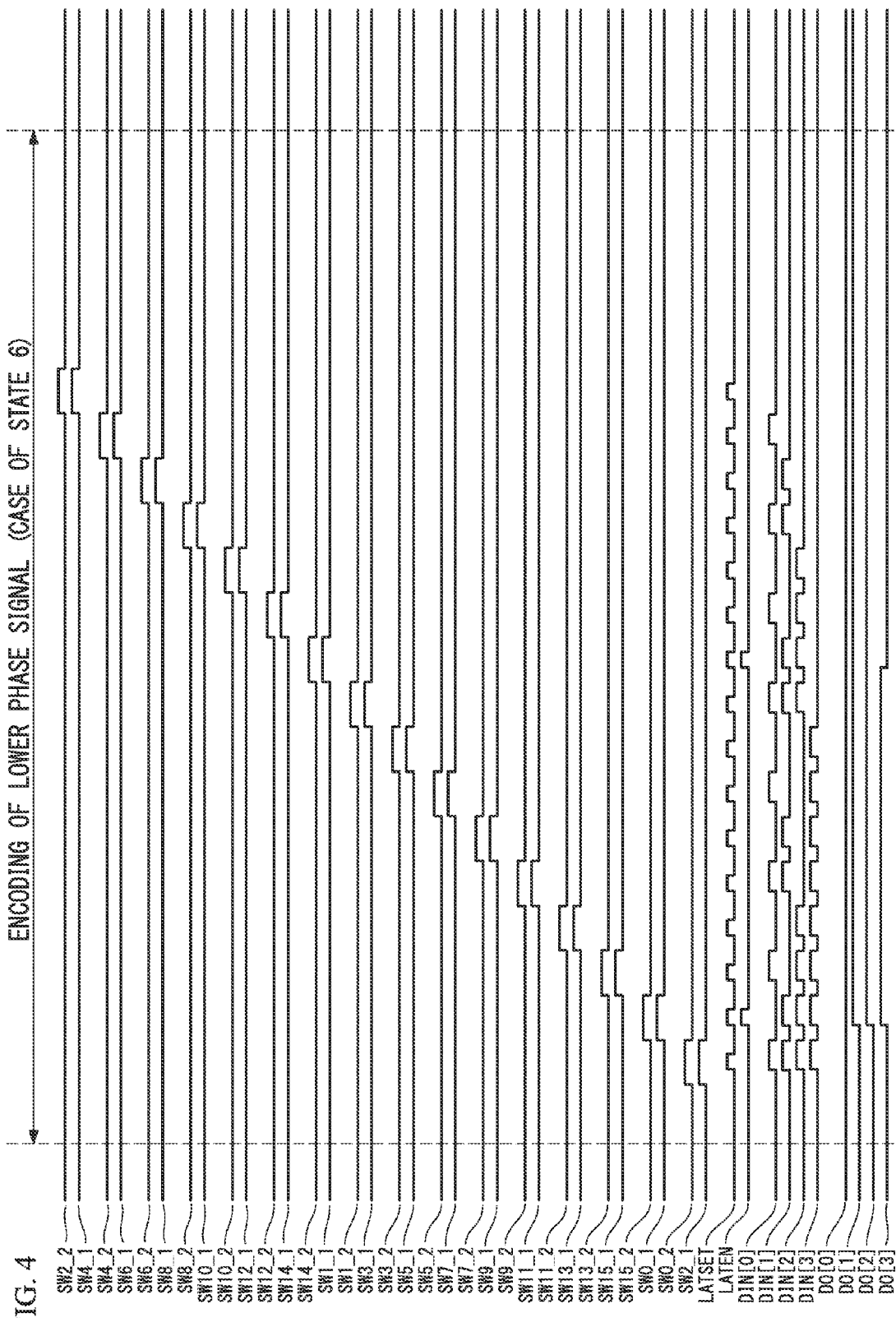
FIG. 4 is a timing chart illustrating the operation of the detection circuit, and the encoding circuit constituting the column AD conversion unit included in the solid-state imaging apparatus according to the first embodiment of the present invention.

Hereinafter, the encode procedure will be described with reference to FIG. 4. FIG. 4 illustrates waveforms of each signal associated with the operation of the detection circuit 107 and the encoding circuit 106.

<<Encode Procedure>>
<Procedure (1)>
First, when the control signals SW2_1 and SW0_2 become an H state, the inversion signal (L state) of the output signal (H state) of the latch circuit L_2 and the output signal (L state) of the latch circuit L_0 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0000.

<Procedure (2)>
Next, when the control signals SW0_1 and SW15_2 become an H state, the inversion signal (H state) of the output signal (L state) of the latch circuit L_0 and the output signal (H state) of the latch circuit L_15 are input to the AND circuit AND0. Thus, the output signal of the AND circuit AND0 becomes an H state. Next, the control signal LATSET is changed from an L state to an H state and then becomes an L state. Thus, the detection result LATEN is changed from an L state to an H state and then becomes an L state. In this case, the encode value DIN[3:0]=4'b1110 is held in the encode circuit 106. At this time, the output signal DO[3:0] of the encode circuit 106 is 4'b1110.

<Procedure (3)>
Next, when the control signals SW15_1 and SW13_2 become an H state, the inversion signal (L state) of the output signal (H state) of the latch circuit L_15 and the output signal (L state) of the latch circuit L_13 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1110.

<Procedure (4)>
Next, when the control signals SW13_1 and SW11_2 become an H state, the inversion signal (H state) of the output signal (L state) of the latch circuit L_13 and the output signal (L state) of the latch circuit L_11 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1110.

<Procedure (5)>
Next, when the control signals SW11_1 and SW9_2 become an H state, the inversion signal (H state) of the output signal (L state) of the latch circuit L_11 and the output signal (L state) of the latch circuit L_9 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1110.

<Procedure (6)>
Next, when the control signals SW9_1 and SW7_2 become an H state, the inversion signal (H state) of the output signal (L state) of the latch circuit and the output signal (L state) of the latch circuit L_7 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1110.

<Procedure (7)>

Next, when the control signals SW7_1 and SW5_2 become an H state, the inversion signal (H state) of the output signal (L state) of the latch circuit L_7 and the output signal (L state) of the latch circuit L_5 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b1110.

<Procedure (8)>

Next, when the control signals SW5_1 and SW3_2 become an H state, the inversion signal (H state) of the output signal (L state) of the latch circuit L_5 and the output signal (L state) of the latch circuit L_3 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO [3:0] of the encoding circuit 106 is 4'b1110.

<Procedure (9)>

Next, when the control signals SW3_1 and SW1_2 become an H state, the inversion signal (H state) of the output signal (L state) of the latch circuit L_3 and the output signal (L state) of the latch circuit L_1 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encoding circuit 106 is 4'b1110.

<Procedure (10)>

Next, when the control signals SW1_1 and SW14_2 become an H state, an inversion signal (H state) of the output signal (L state) of the latch circuit L_1 and the output signal (H state) of the latch circuit L_14 are input to the AND circuit AND0. Thus, the output signal of the AND circuit AND0 becomes an H state. Next, the control signal LATSET is changed from an L state to an H state and then becomes an L state. Thus, the detection result LATEN is changed from an L state to an H state and then becomes an L state. In this case, the encode value DIN[3:0]=4'b0110 is held in the encode circuit 106. At this time, the output signal DO[3:0] of the encode circuit 106 is 4'b0110.

<Procedure (11)>

Next, when the control signals SW14_1 and SW12_2 become an H state, the inversion signal (L state) of the output signal (H state) of the latch circuit L_14 and the output signal (H state) of the latch circuit L_12 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0110.

<Procedure (12)>

Next, when the control signals SW12_1 and SW10_2 become an H state, the inversion signal (L state) of the output signal (H state) of the latch circuit L_12 and the output signal (H state) of the latch circuit L_10 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0110.

<Procedure (13)>

Next, when the control signals SW10_1 and SW8_2 become an H state, the inversion signal (L state) of the output signal (H state) of the latch circuit L_10 and the output signal (H state) of the latch circuit L_8 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0110.

<Procedure (14)>

Next, when the control signals SW8_1 and SW6_2 become an H state, the inversion signal (L state) of the output signal (H state) of the latch circuit L_8 and the output signal (H state) of the latch circuit L_6 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0110.

<Procedure (15)>

Next, when the control signals SW6_1 and SW4_2 become an H state, the inversion signal (L state) of the output signal (H state) of the latch circuit L_6 and the output signal (H state) of the latch circuit L_4 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encode circuit 106 is 4'b0110.

<Procedure (16)>

Finally, when the control signals SW4_1 and SW2_2 become an H state, the inversion signal (L state) of the output signal (H state) of the latch circuit L_4 and the output signal (H state) of the latch circuit L_2 are input to the AND circuit AND0. Thus, the output signal of the AND circuit AND0 becomes an L state. Since the output signal of the AND circuit AND0 becomes an L state, the output signal of the AND circuit AND1 becomes an L state. Next, the control signal LATSET is changed from an L state to an H state and then becomes an L state. During this, the detection result LATEN is unchanged with the L state. At this time, the output signal DO[3:0] of the encoding circuit 106 is 4'b0110. Thus, the encode value D0[3:0]=4'b0110 corresponding to "state 6" is determined.

In the above procedures, in the procedure (2), the case in which the logic states of the lower phase signals CK[0] and CK[15] are "0" and "1" is detected, but at this time, the encode value is not determined, and in the procedure (10) which is after the procedure (2), the case in which the logic states of the lower phase signals CK[1] and CK[14] are "0" and "1" is detected, such that the encode value corresponding to "state 6" is determined. Thus, the occurrence of errors in the lower data may be avoided.

By using the above procedure, when the lower phase signal CK[2] becomes the count clock of the counter 105, the encode of "state 6" based on the lower phase signals CK[0] to CK[15] latched by the latch unit 108 may be made at the timing at which the lower phase signals CK[0] and CK[15] substantially simultaneously falls. Even when the lower phase signal state is a state other than "state 6," the encoding may be performed by the above procedures.

As described above, according to the present embodiment, the detection order of the two lower phase signals (the selection order of the two lower phase signals input to the detection circuit 107) by the detection circuit 107 is an order defined depending on the lower phase signal which becomes the counter clock of the counter 105 and the encoding method, thereby reducing the occurrence of errors at the time of encoding the lower phase signal. Therefore, the high-precision AD conversion may be performed on the TDC type AD conversion circuit and the solid-state imaging apparatus using the same. Further, since the lower phase signal which can be selected as the count clock of the counter 105 is not limited, a degree of freedom of the selection for the count clock of the counter 105 may be secured.

In addition, as the encode method of the present embodiment, when the case in which the logic states of the two consecutive lower phase signals are in a predetermined logic state is detected twice or more, a method of determining an encode value based on the finally detected timing is used. Therefore, the detection circuit 107 and the encoding circuit 106 can be constituted by an easy circuit.

Second Embodiment

Figure 5:
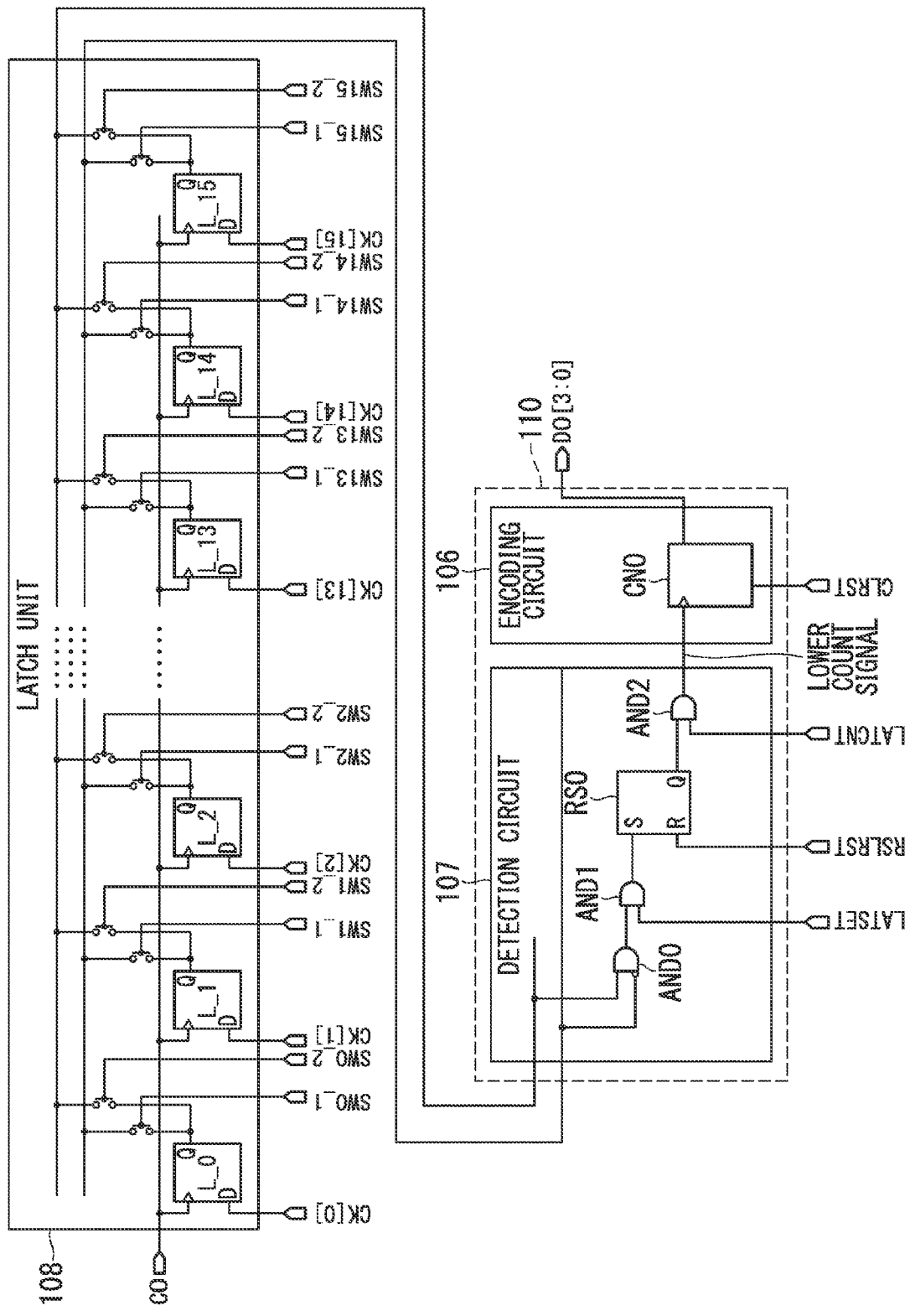
FIG. 5 is a circuit diagram illustrating a constitution of a latch unit, a detection circuit, and an encoding circuit constituting a column AD conversion unit included in a solid-state imaging apparatus according to a second embodiment of the present invention.

Next, a second embodiment of the present invention will be described. The difference from the first embodiment is the constitution and operation of the detection circuit 107 and the encoding circuit 106. Others are substantially the same and therefore the description thereof will be omitted. FIG. 5 illustrates a constitution of the latch unit 108, the detection circuit 107, and the encode circuit 106 of the present embodiment. The constitution of the latch unit 108 is the same as that of the first embodiment and the description thereof will be omitted.

The detection circuit 107 includes AND circuits AND0, AND1, AND2, and RS latch RS0. The AND circuits AND0 and AND1 are the same as the first embodiment and therefore the description thereof will be omitted. The output signal of the AND circuit AND1 and a control signal RSLRST are input to the RS latch RS0. After the RS latch RS0 is reset by the control signal RSLRST, when the output signal of the AND circuit AND1 is changed from an L state to an H state, the output signal is changed from an L state to an H state. Next, the output signal is maintained in an H state regardless of the output signal state of the AND circuit AND1 until it is reset by the control signal RSLRST. The output signal of the RS latch RS0 and a count signal LATCNT are input to the AND circuit AND2. The AND circuit AND2 performs the AND operation on the two input signals and generates a lower count signal (a state detection signal).

The encoding circuit 106 includes a counter circuit CN0. The lower count signal from the AND circuit AND2 is input to the counter circuit CN0. The counter circuit CN0 counts the lower count signal as the count clock and determines the encode value. These are only one example and therefore the present invention is not necessarily limited thereto.

Next, an operation of the detection circuit 107 and the encoding circuit 106 will be described. Hereinafter, the case in which the lower phase signal CK[13] is the count clock of the counter 105 will be described as an example. In the present embodiment, as illustrated in FIG. 11, in the signal group (the signal sequence) in which the lower phase signals CK[15], CK[0], CK[2], CK[4], CK[6], CK[8], CK[10], CK[12], CK[14], CK[1], CK[3], CK[5], CK[7], CK[9], CK[11], and CK[13] latched by the latch unit 108 are arranged in this order, the case in which the logic states of the two lower phase signals become an L state and an H state in order respectively is detected and the encode values are determined depending on a position at which the logic states are detected. The specific input order of the two lower phase signals detecting the logic states to the detection circuit 107 will be described later.

By the control signals SW0_1 to SW15_1 and SW0_2 to SW15_2, the lower phase signals are input to the detection circuit 107 from the two latch circuits selected from the latch circuit L_0 to L_15 in which the lower phase signals CK[0] to CK[15] are held and the logic states of the input lower phase signals are detected. The generation of the lower count signals including the number of pulses corresponding to the state of the lower phase signals CK[0] to CK[15] starts at the timing at which the result of the AND operation by the AND circuit AND0 becomes an H state and thus the counter circuit CN0 starts the count of the lower count signal. When the count ends, the count values DO[0] to DO[3] of the counter circuit CN0 become the encode results.

Hereinafter, the case in which the states of the lower phase signals CK[0] to CK[15] latched by the latch unit 108 is "state 9" will be described by way of example. Even in the case of the present embodiment, the lower phase signal CK[0] and the lower phase signal CK[15] substantially simultaneously falls. Therefore, when the lower phase signal state latched by the latch unit 108 is "state 9," as illustrated in FIG. 16, the possibility of detecting that the logic states of the lower phase signals CK[1] and CK[14] are "0" and "1" and the logic states of the lower phase signals CK[0] and CK[15] are "0" and "1" may be considered.

The detection order of the logic states of the two lower phase signals (the selection order of the two lower phase signals input to the detection circuit 107) by the detection circuit 107 of the present embodiment is an order defined depending on the lower phase signal which becomes the counter clock of the counter 105 and the encode method. The lower phase signal which becomes the count clock of the counter 105 is the lower phase signal CK[13]. In addition, the encoding method is a method of detecting that the logic states of the two consecutive lower phase signals become an L state and an H state in order respectively and determining the encode value based on the finally detected timing when the logic states are detected twice or more. In the present embodiment, in order to prevent errors from occurring in the lower data, the operation of detecting the logic states of at least lower phase signals CK[0] and CK[15] is performed after performing the operation of detecting the logic states of the lower phase signals CK[1] and CK[14].

Figure 6:
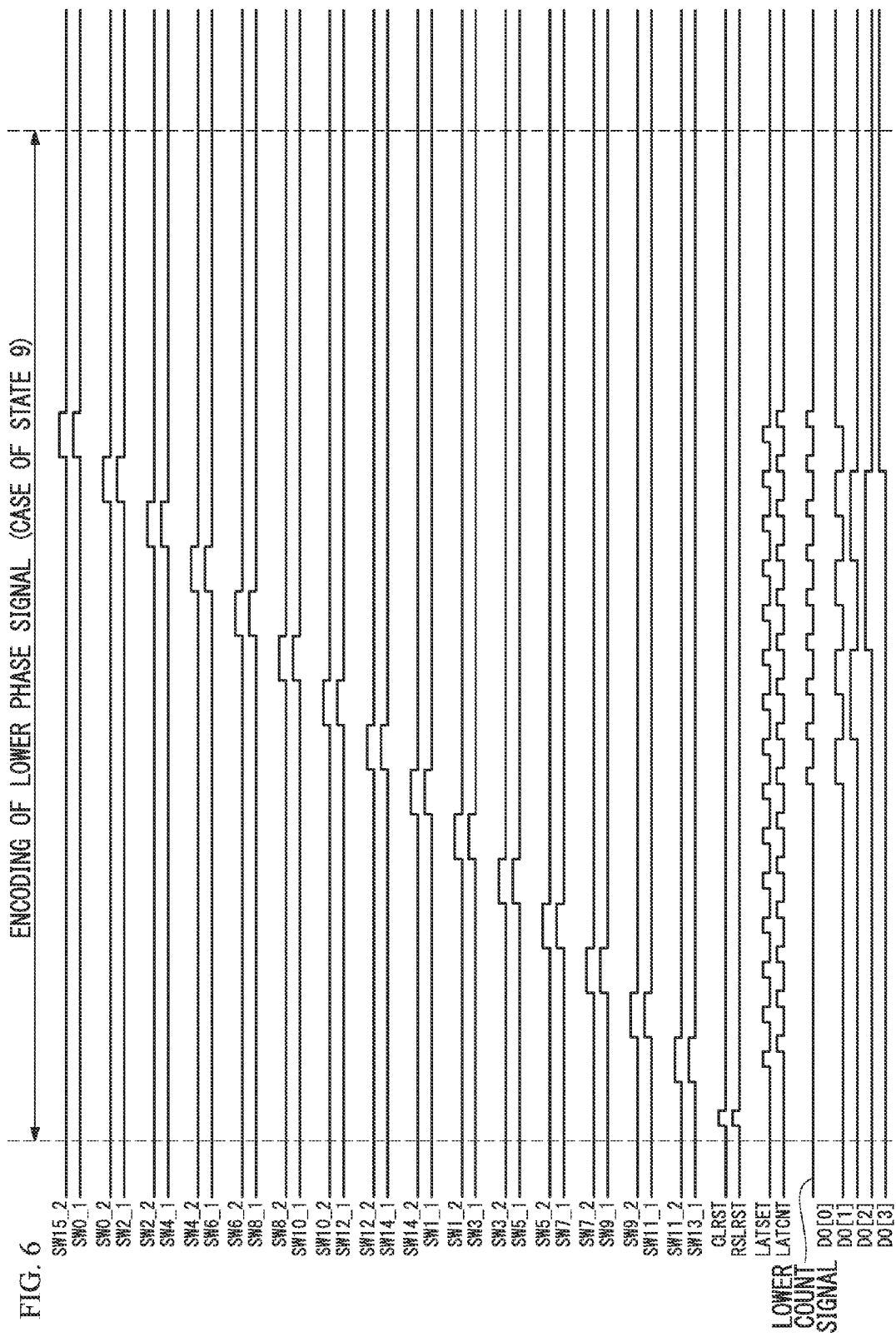
FIG. 6 is a timing chart illustrating an operation of the detection circuit and the encoding circuit constituting the column AD conversion unit included in the solid-state imaging apparatus according to the second embodiment of the present invention.

Hereinafter, the encode procedure will be described with reference to FIG. 6. FIG. 6 illustrates waveforms of each signal associated with the operation of the detection circuit 107 and the encoding circuit 106.

<<Encode Procedure>>

<Procedure (1)>

First, after the counter circuit CN0 and the RS latch RS0 are reset by control signals CLRST and RSLRST, when the control signals SW13_1 and SW11_2 become an H state, the inversion signal (H state) of the output signal (L state) of the latch circuit L_13 and the output signal (L state) of the latch circuit L_11 are input to the AND circuit AND0. Thus, the output signal of the AND circuit AND0 becomes an L state. Since the output signal of the AND circuit AND0 becomes an L state, the output signal of the AND circuit AND1 becomes an L state and the output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encoding circuit 106 is 4'b0000.

<Procedure (2)>

Next, when the control signals SW11_1 and SW9_2 become an H state, an inversion signal (H state) of the output signal (L state) of the latch circuit L_11 and the output signal (L state) of the latch circuit L_9 are input to the AND circuit AND0. Thus, the output signal of the AND circuit AND0 becomes an L state. Since the output signal of the AND circuit AND0 becomes an L state, the output signal of the AND circuit AND1 becomes an L state and the output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encode circuit 106 is 4'b0000.

<Procedure (3)>

Next, when the control signals SW9_1 and SW7_2 become an H state, an inversion signal (H state) of the output signal (L state) of the latch circuit L_9 and the output signal (L state) of the latch circuit L_7 are input to the AND circuit AND0. Thus, the output signal of the AND circuit AND0 becomes an L state. Since the output signal of the AND circuit AND0 becomes an L state, the output signal of the AND circuit AND1 becomes an L state and the output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encode circuit 106 is 4'b0000.

<Procedure (4)>

Next, when the control signals SW7_1 and SW5_2 become an H state, an inversion signal (H state) of the output signal (L state) of the latch circuit L_7 and the output signal (L state) of the latch circuit L_5 are input to the AND circuit AND0. Thus, the output signal of the AND circuit AND0 becomes an L state. Since the output signal of the AND circuit AND0 becomes an L state, the output signal of the AND circuit AND1 becomes an L state and the output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encode circuit 106 is 4'b0000.

<Procedure (5)>

Next, when the control signals SW5_1 and SW3_2 become an H state, an inversion signal (H state) of the output signal (L state) of the latch circuit L_5 and the output signal (L state) of the latch circuit L_3 are input to the AND circuit AND0. Thus, the output signal of the AND circuit AND0 becomes an L state. Since the output signal of the AND circuit AND0 becomes an L state, the output signal of the AND circuit AND1 becomes an L state and the output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encode circuit 106 is 4'b0000.

<Procedure (6)>

Next, when the control signals SW3_1 and SW1_2 become an H state, an inversion signal (H state) of the output signal (L state) of the latch circuit L_3 and the output signal (L state) of the latch circuit L_1 are input to the AND circuit AND0. Thus, the output signal of the AND circuit AND0 becomes an L state. Since the output signal of the AND circuit AND0 becomes an L state, the output signal of the AND circuit AND1 becomes an L state and the output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encode circuit 106 is 4'b0000.

<Procedure (7)>

Next, when the control signals SW1_1 and SW14_2 become an H state, an inversion signal (H state) of the output signal (L state) of the latch circuit L_1 and the output signal (H state) of the latch circuit L_14 are input to the AND circuit AND0. Thus, the output signal of the AND circuit AND0 becomes an H state. When the control signal LATSET is changed from an L state to an H state, the output signal of the AND circuit AND1 becomes an H state. Thus, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encoding circuit 106 is 4'b0001.

<Procedure (8)>

Next, when the control signals SW14_1 and SW12_2 become an H state, the inversion signal (L state) of the output signal (H state) of the latch circuit L_14 and the output signal (H state) of the latch circuit L_12 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encoding circuit 106 is 4'b0010.

<Procedure (9)>

Next, when the control signals SW12_1 and SW10_2 become an H state, the inversion signal (L state) of the output signal (H state) of the latch circuit L_12 and the output signal (H state) of the latch circuit L_10 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0011.

<Procedure (10)>

Next, when the control signals SW10_1 and SW8_2 become an H state, the inversion signal (L state) of the output signal (H state) of the latch circuit L_10 and the output signal (H state) of the latch circuit L_8 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0100.

<Procedure (11)>

Next, when the control signals SW8_1 and SW6_2 become an H state, the inversion signal (L state) of the output signal (H state) of the latch circuit L_8 and the output signal al state) of the latch circuit L_6 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0101.

<Procedure (12)>

Next, when the control signals SW6_1 and SW4_2 become an H state, the inversion signal (L state) of the output signal (H state) of the latch circuit L_6 and the output signal (H state) of the latch circuit L_4 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0110.

<Procedure (13)>

Next, when the control signals SW4_1 and SW2_2 become an H state, the inversion signal (L state) of the output signal (H state) of the latch circuit L_4 and the output signal (H state) of the latch circuit L_2 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0111.

<Procedure (14)>

Next, when the control signals SW2_1 and SW0_2 become an H state, the inversion signal (L state) of the output signal (H state) of the latch circuit L_2 and the output signal (L state) of the latch circuit L_0 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encoding circuit 106 is 4'b1000.

<Procedure (15)>

Finally, when the control signals SW0_1 and SW15_2 become an H state, the inversion signal (H state) of the output signal (L state) of the latch circuit L_0 and the output signal (H state) of the latch circuit L_15 are input to the AND circuit AND0. Thus, the output signal of the AND circuit AND0 becomes an H state. When the control signal LATSET is changed from an L state to an H state, the output signal of the AND circuit AND1 becomes an H state. Since the control signal RSLRST input to the RS latch RS0 becomes an L state, the output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encoding circuit 106 is 4'b1001. Thus, the encode value DO[3:0]=4'b1001 corresponding to "state 9" is determined.

In the above procedures, in the procedure (15), the case in which the logic states of the lower phase signals CK[0] and CK[15] are "0" and "1" is detected, but in the procedure (7) which is before the procedure (15), the case in which the logic states of the lower phase signals CK[1] and CK[14] are "0" and "1" is detected and the encode value corresponding to "state 9" is determined. Thus, the occurrence of errors in the lower data may be avoided.

By using the above procedure, when the lower phase signal CK[13] becomes the count clock of the counter 105, the encode of "state 9" based on the lower phase signals CK[0] to CK[15] latched by the latch unit 108 may be made at the timing at which the lower phase signals CK[0] and CK[15] substantially simultaneously falls. Even when the lower phase signal state is a state other than "state 9," the encoding may be performed by the above procedures.

As described above, in the present embodiment, the occurrence of errors also can be reduced at the time of encoding the lower phase signal while securing the degree of freedom of the selection for the count clock of the counter 105. In addition, as the encode method of the present embodiment, when the case in which the logic states of the two consecutive lower phase signals are in a predetermined logic state is detected twice or more, a method of determining an encode value based on the initial detected timing is used. Therefore, the detection circuit 107 and the encoding circuit 106 can be constituted by an easy circuit.

Third Embodiment

Figure 7:
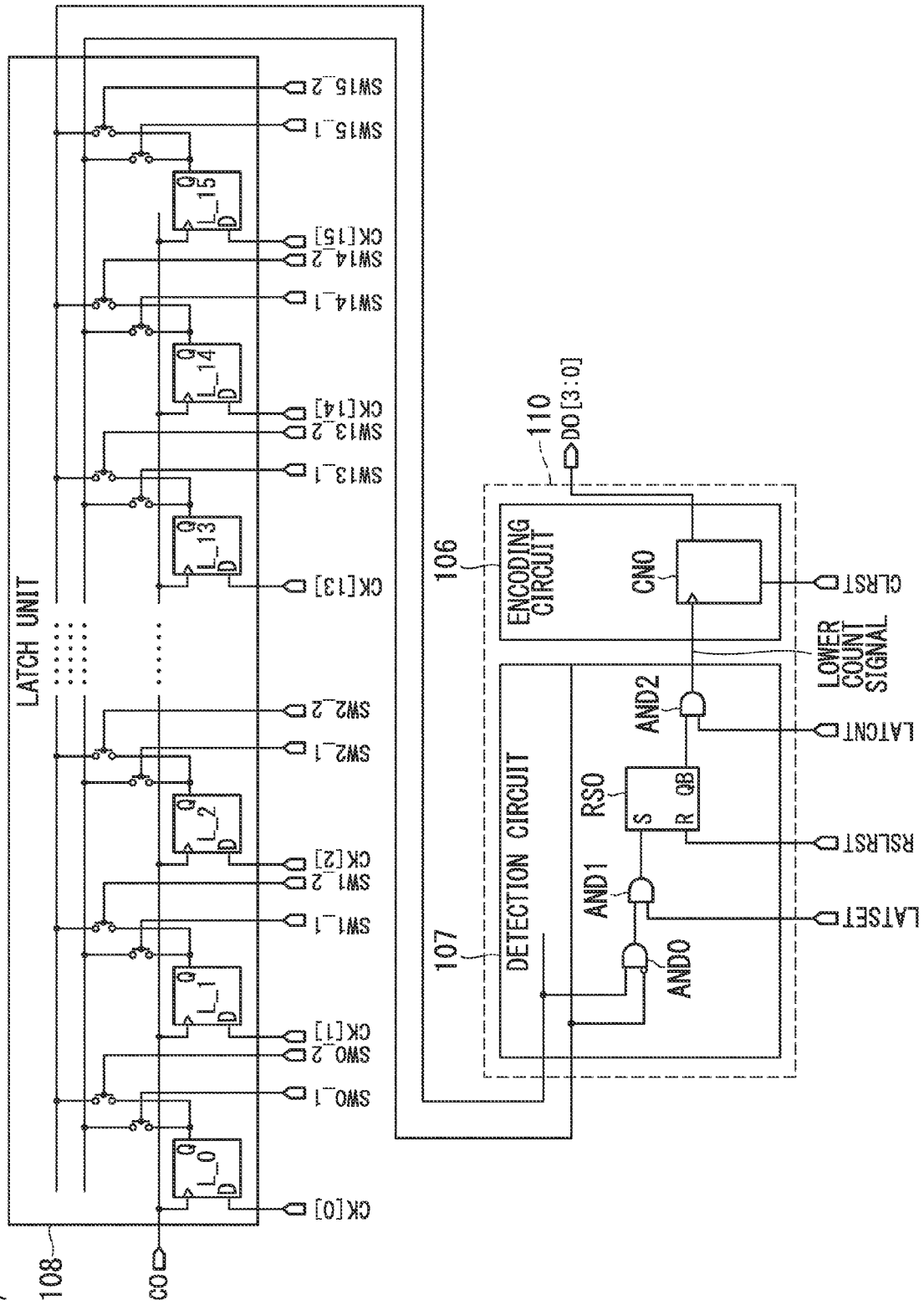
FIG. 7 is a circuit diagram illustrating a constitution of a latch unit, a detection circuit, and an encoding circuit constituting a column AD conversion unit included in a solid-state imaging apparatus according to a third embodiment of the present invention.

Next, a third embodiment of the present invention will be described. The difference from the second embodiment is the constitution and operation of the detection circuit 107 and the encoding circuit 106. Others are substantially the same and therefore the description thereof will be omitted. FIG. 7 illustrates a constitution of the latch unit 108, the detection circuit 107, and the encoding circuit 106 of the present embodiment. The difference from the constitution illustrated in FIG. 5 is that the inversion output of the RS latch RS0 is input to the AND circuit AND2. After the RS latch RS0 is reset by the control signal RSLRST, when the output signal of the AND circuit AND1 is changed from an L state to an H state, an inversion output signal is changed from an H state to an L state and then the inversion output signal is maintained in an L state regardless of the output signal state of the AND circuit AND1 until it is reset by the control signal RSLRST. Others are the same as the constitution illustrated in FIG. 5 and therefore the description thereof will be omitted. These are only one example and therefore the present invention is not necessarily limited thereto.

Next, the operation of the detection circuit 107 and the encoding circuit 106 will be described. Hereinafter, the case in which the lower phase signal CK[2] becomes the count clock of the counter 105 will be described by way of example. In the present embodiment, as illustrated in FIG. 14, in the signal group (the signal sequence) in which the lower phase signals CK[4], CK[6], CK[8], CK[10], CK[12], CK[14], CK[1], CK[3], CK[5], CK[7], CK[9], CK[11], CK[13], CK[15], CK[0], and CK[2] latched by the latch unit 108 are arranged in this order, the case in which the logic states of the two lower phase signals become an L state and an H state in order respectively is detected and the encode values are determined depending on a position at which the logic states are detected. The specific input order of the two lower phase signals detecting the logic states to the detection circuit 107 will be described later.

By the control signals SW0_1 to SW15_1 and SW0_2 to SW15_2, the lower phase signals are input to the detection circuit 107 from the two latch circuits selected from the latch circuit L_0 to L_15 in which the lower phase signals CK[0] to CK[15] are held and the logic states of the input lower phase signals are detected. Further, after the generation of the lower count signals including the number of pulses corresponding to the state of the lower phase signals CK[0] to CK[15] starts and the counter circuit CN0 starts the count of the lower count signal, the generation of the lower count signal ends at the timing at which the result of the AND operation by the AND circuit AND0 becomes an H state. In this case, the count values DO[0] to DO[3] of the counter circuit CN0 are the encode results.

Hereinafter, the case in which the states of the lower phase signals CK[0] to CK[15] latched by the latch unit 108 is "state 6" will be described by way of example. Even in the case of the present example, the lower phase signal CK[0] and the lower phase signal CK[15] substantially simultaneously falls. Therefore, when the lower phase signal state latched by the latch unit 108 is "state 6," as illustrated in FIG. 17, the possibility of detecting that the logic states of the lower phase signals CK[1] and CK[14] are "0" and "1" and the logic states of the lower phase signals CK[0] and CK[15] are "0" and "1" may be considered.

The detection order of the logic states of the two lower phase signals (the selection order of the two lower phase signals input to the detection circuit 107) by the detection circuit 107 of the present embodiment is an order defined depending on the lower phase signal which becomes the counter clock of the counter 105 and the encode method. The lower phase signal which becomes the count clock of the counter 105 is the lower phase signal CK[2]. In addition, the encode method is a method of detecting that the logic states of the two consecutive lower phase signals become an L state and an H state in order respectively and determining the encode value based on the initial detected timing when the logic states are detected twice or more. In the present embodiment, in order to prevent errors from occurring in the lower data, the operation of detecting the logic states of at least lower phase signals CK[0] and CK[15] is performed after performing the operation of detecting the logic states of the lower phase signals CK[1] and CK[14].

Further, in the present embodiment, in order to adjust the number of pulses of the lower count signal output from the AND circuit AND2, the output signals of the latch circuits L_4 and L_2 are first input to the detection circuit 107 and then the input order of the output signal of the latch circuit to the detection circuit 107 depends on the arrangement order of the signal in the foregoing signal group.

Figure 8:
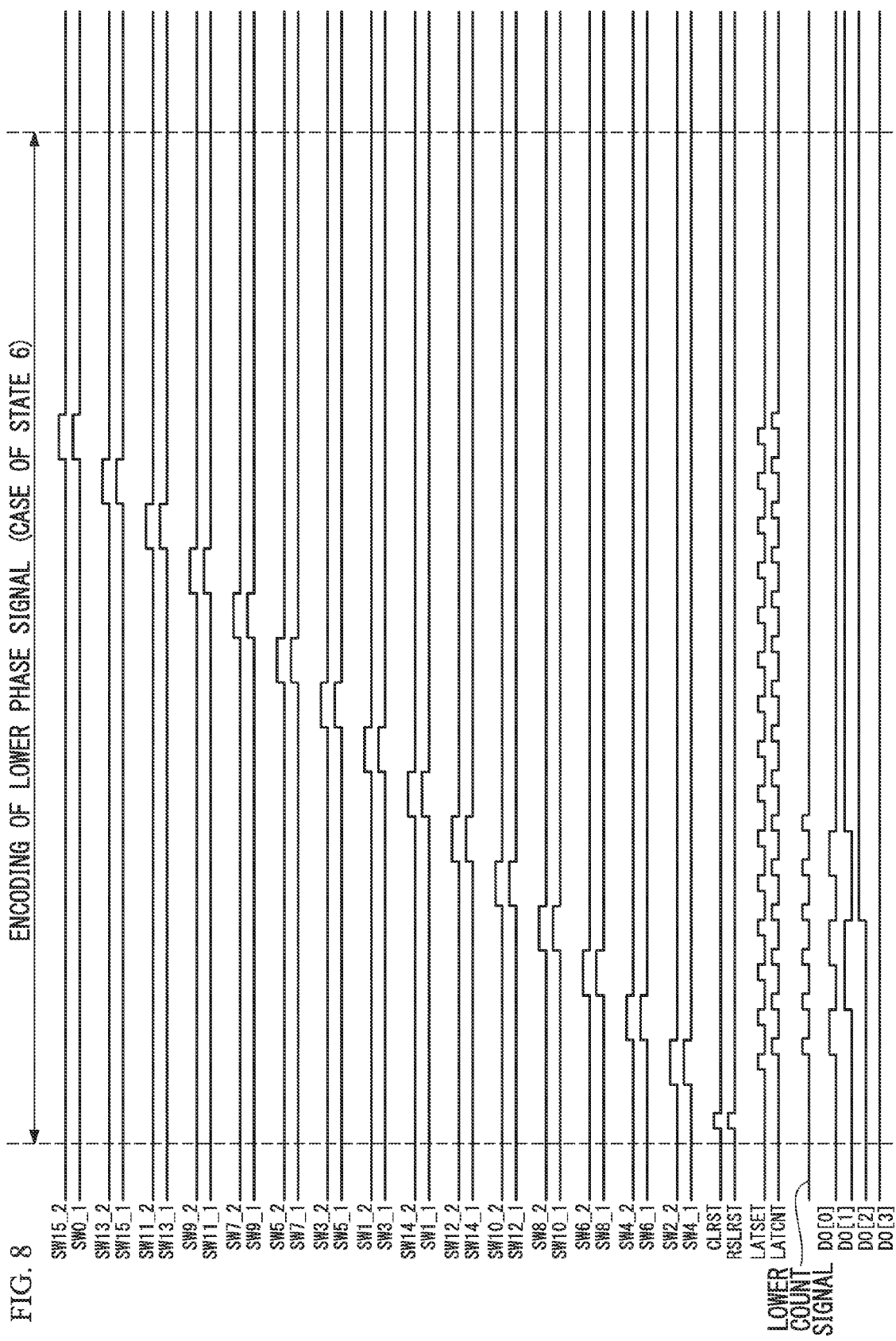
FIG. 8 is a timing chart illustrating an operation of the detection circuit and the encoding circuit constituting the column AD conversion unit included in the solid-state imaging apparatus according to the third embodiment of the present invention.
Figure 9:
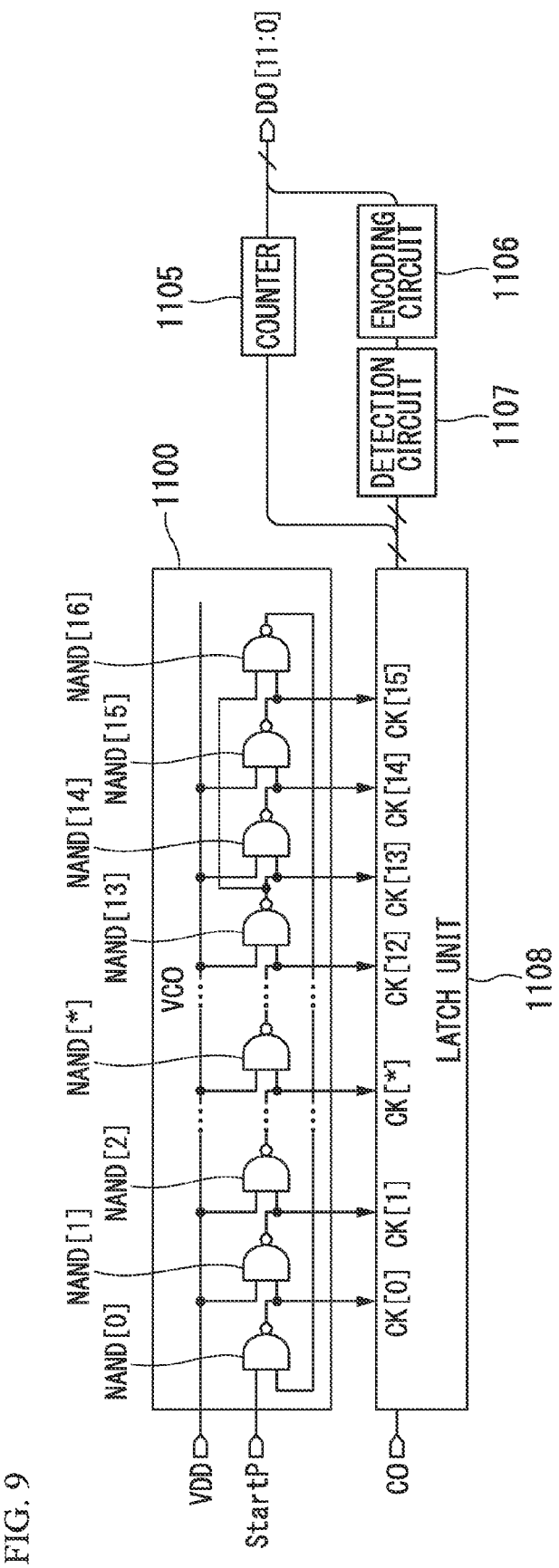
FIG. 9 is a block diagram illustrating a constitution of a part of a conventional AD conversion circuit.
Figure 10:
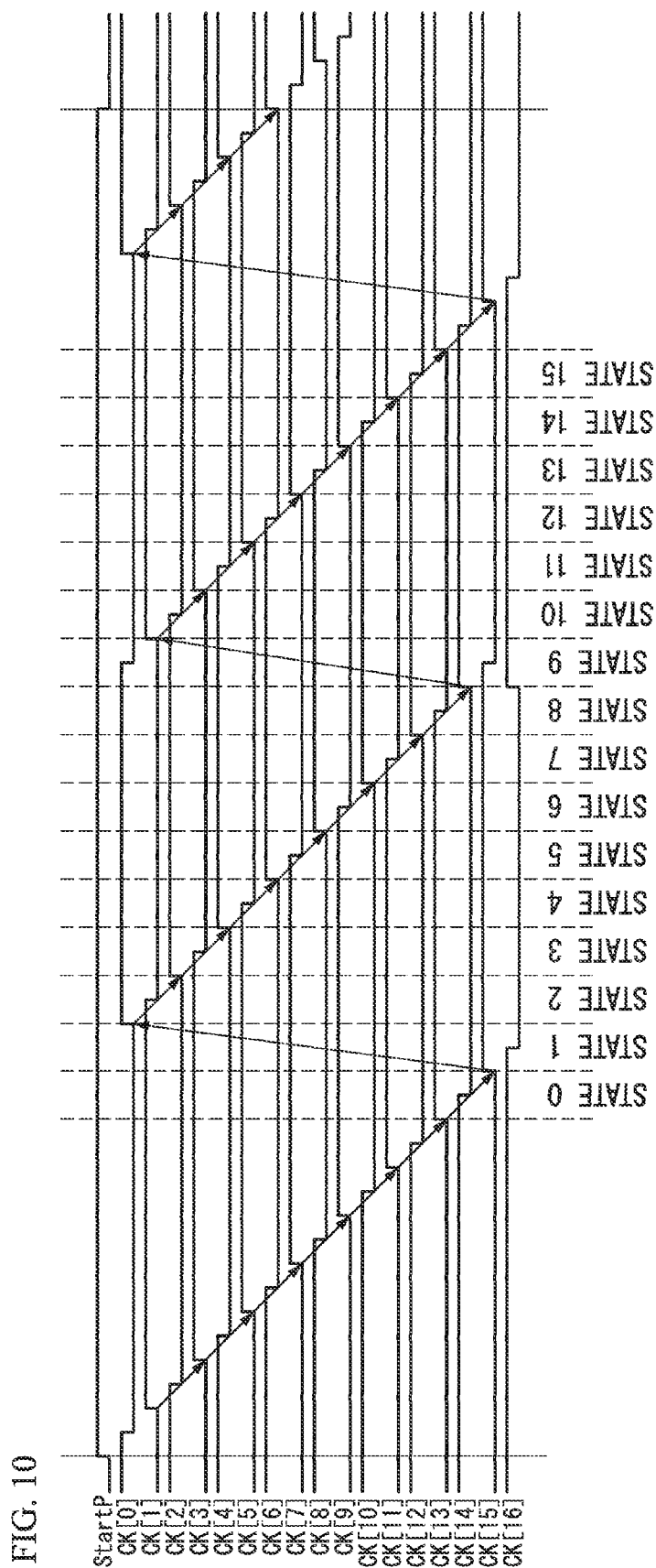
FIG. 10 is a timing chart illustrating waveforms of lower phase signals.

Hereinafter, the encode procedure will be described with reference to FIG. 8. FIG. 8 illustrates waveforms of each signal associated with the operation of the detection circuit 107 and the encoding circuit 106. In the second embodiment, the encode value is determined depending on the number of pulses of the lower count signal output from when the output signal of the RS latch RS0 is changed from an L state to an H state, but in the third embodiment the encode value is determined depending on the number of pulses of the lower count signal output until the inversion output signal of the RS latch RS0 is changed from an H state to an L state.

<<Encode Procedure>>
<Procedure (1)>

First, after the counter circuit CN0 and the RS latch RS0 are reset by the control signals CLRST and RSLRST, when the control signals SW4_1 and SW2_2 become an H state, the inversion signal (L state) of the output signal (H state) of the latch circuit L_4 and the output signal (H state) of the latch circuit L_2 are input to the AND circuit AND0. Thus, the output signal of the AND circuit AND0 becomes an L state. Since the output signal of the AND circuit AND0 becomes an L state, the output signal of the AND circuit AND1 becomes an L state and the inversion output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0001.

<Procedure (2)>

Next, when the control signals SW6_1 and SW4_2 become an H state, an inversion signal (L state) of the output signal (H state) of the latch circuit L_6 and the output signal (H state) of the latch circuit L_4 are input to the AND circuit AND0. Thus, the output signal of the AND circuit AND0 becomes an L state. Since the output signal of the AND circuit AND0 becomes an L state, the output signal of the AND circuit AND1 becomes an L state and the inversion output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0010.

<Procedure (3)>

Next, when the control signals SW8_1 and SW6_2 become an H state, an inversion signal (L state) of the output signal (H state) of the latch circuit L_8 and the output signal (H state) of the latch circuit L_6 are input to the AND circuit AND0. Thus, the output signal of the AND circuit AND0 becomes an L state. Since the output signal of the AND circuit AND0 becomes an L state, the output signal of the AND circuit AND1 becomes an L state and the inversion output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encoding circuit 106 is 4'b0011.
<Procedure (4)>

Next, when the control signals SW10_1 and SW8_2 become an H state, an inversion signal (L state) of the output signal (H state) of the latch circuit L_10 and the output signal (H state) of the latch circuit L_8 are input to the AND circuit AND0. Thus, the output signal of the AND circuit AND0 becomes an L state. Since the output signal of the AND circuit AND0 becomes an L state, the output signal of the AND circuit AND1 becomes an L state and the inversion output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encode circuit 106 is 4'b0100.
<Procedure (5)>

Next, when the control signals SW12_1 and SW10_2 become an H state, an inversion signal (L state) of the output signal (H state) of the latch circuit L_12 and the output signal (H state) of the latch circuit L_10 are input to the AND circuit AND0. Thus, the output signal of the AND circuit AND0 becomes an L state. Since the output signal of the AND circuit AND0 becomes an L state, the output signal of the AND circuit AND1 becomes an L state and the inversion output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encoding circuit 106 is 4'b0101.
<Procedure (6)>

Next, when the control signals SW14_1 and SW12_2 become an H state, an inversion signal (L state) of the output signal (H state) of the latch circuit L_14 and the output signal (H state) of the latch circuit L_12 are input to the AND circuit AND0. Thus, the output signal of the AND circuit AND0 becomes an L state. Since the output signal of the AND circuit AND0 becomes an L state, the output signal of the AND circuit AND1 becomes an L state and the inversion output signal of the RS latch RS0 becomes an H state. Next, when the count signal LATCNT is changed from an L state to an H state and becomes an L state again, the lower count signal for one pulse is output from the AND circuit AND2. At this time, the output signal DO[3:0] of the encoding circuit 106 is 4'b0110.
<Procedure (7)>

Next, when the control signals SW1_1 and SW14_2 become an H state, an inversion signal (H state) of the output signal (L state) of the latch circuit L_1 and the output signal (H state) of the latch circuit L_14 are input to the AND circuit AND0. Thus, the output signal of the AND circuit AND0 becomes an H state. When the control signal LATSET is changed from an L state to an H state, the output signal of the AND circuit AND1 becomes an H state. Thus, the inversion output signal of the RS latch RS0 becomes an L state. Next, when the count signal LATCNT is changed from an L state to an H state and becomes an L state again, the pulse of the lower count signal is not output from the AND circuit AND2. At this time, the output signal DO[3:0] of the encoding circuit 106 is 4'b0110.
<Procedure (8)>

Next, when the control signals SW3_1 and SW1_2 become an H state, the inversion signal (H state) of the output signal (L state) of the latch circuit L_3 and the output signal (L state) of the latch circuit L_1 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encoding circuit 106 is 4'b0110.
<Procedure (9)>

Next, when the control signals SW5_1 and SW3_2 become an H state, the inversion signal (H state) of the output signal (L state) of the latch circuit L_5 and the output signal (L state) of the latch circuit L_3 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encode circuit 106 is 4'b0110.
<Procedure (10)>

Next, when the control signals SW7_1 and SW5_2 become an H state, the inversion signal (H state) of the output signal (L state) of the latch circuit L_7 and the output signal (L state) of the latch circuit L_5 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encoding circuit 106 is 4'b0110.
<Procedure (11)>

Next, when the control signals SW9_1 and SW7_2 become an H state, the inversion signal (H state) of the output signal (L state) of the latch circuit L_9 and the output signal (L state) of the latch circuit L_7 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encoding circuit 106 is 4'b0110.
<Procedure (12)>

Next, when the control signals SW11_1 and SW9_2 become an H state, the inversion signal (H state) of the output signal (L state) of the latch circuit L_11 and the output signal (L state) of the latch circuit L_9 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encoding circuit 106 is 4'b0110.

<Procedure (13)>

Next, when the control signals SW13_1 and SW11_2 become an H state, the inversion signal (H state) of the output signal (L state) of the latch circuit L_13 and the output signal (L state) of the latch circuit L_11 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encoding circuit 106 is 4'b0110.

<Procedure (14)>

Next, when the control signals SW15_1 and SW13_2 become an H state, the inversion signal (L state) of the output signal (H state) of the latch circuit L_15 and the output signal (L state) of the latch circuit L_13 are input to the AND circuit AND0. Thus, the output signal of the AND circuit AND0 becomes an L state. Since the output signal of the AND circuit AND0 becomes an L state, the output signal of the AND circuit AND1 becomes an L state. However, since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encoding circuit 106 is 4'b0110.

<Procedure (15)>

Finally, when the control signals SW0_1 and SW15_2 become an H state, an inversion signal (H state) of the output signal (L state) of the latch circuit L_0 and the output signal (H state) of the latch circuit L_15 are input to the AND circuit AND0. Thus, the output signal of the AND circuit AND0 becomes an H state. When the control signal LATSET is changed from an L state to an H state, the output signal of the AND circuit AND1 becomes an H state. Since the control signal RSLRST input to the RS latch RS0 becomes an L state, the inversion output signal of the RS latch RS0 becomes an L state. Next, the count signal LATCNT is changed from an L state to an H state and becomes an L state again, but the pulse of the lower count signal is not output from the AND circuit AND2. At this time, the output signal DO[3:0] of the encode circuit 106 is 4'b0110. Thus, the encode value DO[3:0]=4'b0110 corresponding to "state 6" is determined.

In the procedure of detecting the logic states of the lower phase signals CK[0] and CK[15] prior to detecting the logic states of the lower phase signals CK[1] and CK[14], when the case in which the logic states of the lower phase signal CK[0] and CK[15] are "0" and "1" is detected, the inversion output signal of the RS latch RS0 becomes an L state and the pulse of the lower count signal is not output from the AND circuit AND2. Therefore, the number of pulses of the lower count signal output from the AND circuit AND2 is considered as a wrong number and thus errors occur. Compared with this, in this procedure, since the logic states of the lower phase signals CK[0] and CK[15] are detected after the logic states of the lower phase signals CK[1] and CK[14], the case in which the logic states of the lower phase signals CK[1] and CK[14] are "0" and "1" is detected and thus the encode value corresponding to "state 6" is determined. Thus, the occurrence of errors in the lower data may be avoided.

By using the above procedure, when the lower phase signal CK[2] becomes the count clock of the counter 105, the encode of "state 6" based on the lower phase signals CK[0] to CK[15] latched by the latch unit 108 may be made at the timing at which the lower phase signals CK[0] and CK[15] substantially simultaneously falls. Even when the lower phase signal state is a state other than "state 6," the encoding may be performed by the above procedures.

As described above, in the present embodiment, the occurrence of errors also can be reduced at the time of encoding the lower phase signal while securing the degree of freedom of the selection for the count clock of the counter 105. In addition, as the encoding method of the present embodiment, when the case in which the logic states of the two consecutive lower phase signals are in a predetermined logic state is detected twice or more, a method of determining an encode value based on the first detected timing is used. Therefore, the detection circuit 107 and the encoding circuit 106 can be constituted by an easy circuit.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An AD conversion circuit, comprising:
a reference signal generation unit configured to generate a reference signal which increases or decreases as time passes;
a comparison unit configured to perform a comparison process in which an analog signal which is a target of AD conversion is compared with the reference signal, and to end the comparison process at a timing at which the reference signal satisfies a predetermined condition with respect to the analog signal;
a clock generation unit including an oscillation circuit which includes n delay units, where n is an odd number of 3 or more, and having a first path to which a signal is transmitted through each of the n delay units and a second path to which a signal is transmitted to bypass some of the n delay units, and configured to output a lower phase signal including signals output from the delay units;
a latch unit configured to latch the lower phase signal at a timing associated with the ending of the comparison process;
a counter which includes a counter circuit configured to count based on a predetermined signal among the signals output from the delay units to obtain an upper count value; and
an encoding unit configured to perform an operation of detecting logic states of m lower phase signals, where m is a natural number of 2 or more, in a signal group that a plurality of lower phase signals latched by the latch unit are arranged, while selecting the m lower phase signals in a predetermined order so that the order thereof becomes the same as the order of the signal group when the lower phase signal output from the clock generation unit during the comparison process is arranged so as to be a signal group which rises in order at a predetermined time interval or falls in order at a predetermined time interval using the predetermined signal as a reference, output a state detection signal at the time of detecting that the logic states of the m lower phase signals are in a predetermined logic state in the detection operation, and encode based on the state detection signal, wherein the predetermined order is defined depending on the predetermined signal and an encoding method employed in the encoding unit.

2. The AD conversion circuit according to claim 1, wherein the encoding method is an encoding method which determines an encode value based on the state detection signal initially output when the state detection signals are output a plurality of times.

3. The AD conversion circuit according to claim 1, wherein the encoding method is an encoding method which determines an encode value based on the state detection signal finally output when the state detection signals are output a plurality of times.

4. A solid-state imaging apparatus, comprising:
an imaging unit which includes a plurality of pixels outputting pixel signals disposed in a matrix configuration; and the AD conversion circuit according to claim 1 which receives analog signals corresponding to the pixel signals, wherein the pixels include a photoelectric conversion element, and the comparison unit, the latch unit, the counter, and the encoding unit included in the AD conversion circuit are disposed in every column or plurality of columns of an arrangement of pixels of the imaging unit.

* * * * *